US008582346B2

(12) United States Patent
Maejima et al.

(10) Patent No.: US 8,582,346 B2
(45) Date of Patent: *Nov. 12, 2013

(54) SEMICONDUCTOR STORAGE DEVICE

(75) Inventors: Hiroshi Maejima, Chuo-ku (JP); Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/407,155

(22) Filed: Feb. 28, 2012

(65) Prior Publication Data

US 2012/0155149 A1    Jun. 21, 2012

Related U.S. Application Data

(63) Continuation of application No. 12/720,105, filed on Mar. 9, 2010, now Pat. No. 8,139,394.

(30) Foreign Application Priority Data

Mar. 12, 2009    (JP) .................................. 2009-059719

(51) Int. Cl.
*G11C 11/00*    (2006.01)

(52) U.S. Cl.
USPC ....................... 365/148; 365/163; 365/189.09

(58) Field of Classification Search
USPC ..................... 365/148, 163, 189.09
See application file for complete search history.

(56) References Cited

U.S. PATENT DOCUMENTS

| 7,606,086 | B2 | 10/2009 | Inoue |
| 8,031,508 | B2 | 10/2011 | Toda et al. |
| 8,139,394 | B2 * | 3/2012 | Maejima et al. ............... 365/148 |
| 2007/0165442 | A1 | 7/2007 | Hosoi et al. |
| 2009/0046496 | A1 | 2/2009 | Katoh |
| 2009/0244953 | A1 | 10/2009 | Maejima |

FOREIGN PATENT DOCUMENTS

| CN | 101371313 A | 2/2009 |
| JP | 2008-123690 | 5/2008 |
| WO | WO 2007/132525 A1 | 11/2007 |
| WO | WO 2008/012871 A1 | 1/2008 |
| WO | WO 2008/120480 A1 | 10/2008 |

OTHER PUBLICATIONS

Chinese Office Action issued on May 3, 2012, in patent Application No. 201010133456.7 with English Translation.

Office Action issued Jul. 19, 2011 in Japanese Patent No. 2009-059719 (with English translation).

* cited by examiner

*Primary Examiner* — Toan Le

(74) *Attorney, Agent, or Firm* — Oblon, Spivak, McClelland, Maier & Neustadt, L.L.P.

(57) ABSTRACT

A semiconductor storage device includes: a cell array including a plurality of first wirings, a plurality of second wirings intersecting the first wirings, and memory cells positioned at intersecting portions between the first wirings and the second wirings, each of the memory cells having a series circuit of a non-ohmic element and a variable resistance element; a control circuit configured to apply a control voltage, which is necessary for the variable resistance element to transit from a low resistance state to a high resistance state, to the memory cells through the first wirings and the second wirings; and a bias voltage application circuit configured to apply a bias voltage, which suppresses a potential variation caused by the transition of the variable resistance element from the low resistance state to the high resistance state, to one end of the variable resistance element.

10 Claims, 14 Drawing Sheets

VRow Driver 13

Column Switch 20

Column decoder 21

Sense Amp & Write Buffer 22

VCol Driver 23

SEMICONDUCTOR STORAGE DEVICE

CROSS REFERENCE TO RELATED APPLICATIONS

This application is a continuation of and claims the benefit of priority under 35 U.S.C. §120 from U.S. Ser. No. 12/720, 105, filed Mar. 9, 2010, and claims the benefit of priority under 35 U.S.C. §119 from prior Japanese Patent Application No. 2009-59719, filed on Mar. 12, 2009, the entire contents of which are incorporated herein by reference.

BACKGROUND OF THE INVENTION

1. Field of the Invention

The present invention relates to a semiconductor storage device, and in particular, to a semiconductor storage device with a structure where memory cell arrays are laminated on the semiconductor substrate.

2. Description of the Related Art

Resistive memory has attracted increased attention as a likely candidate for replacing flash memory. As described herein, it is assumed that the resistive memory devices include Resistive RAM (ReRAM), in a narrow sense, that uses a transition metal oxide as a recording layer and stores its resistance states in a non-volatile manner, as well as Phase Change RAM (PCRAM) that uses chalcogenide, etc., as a recording layer to utilize the resistance information of crystalline states (conductors) and amorphous states (insulators).

It is known that the variable resistance elements in resistive memory have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

To achieve high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner (see Japanese National Publication No. 2005-522045).

For unipolar-type ReRAM, data is written to a memory cell by applying, for a short period of time, a certain voltage to a variable resistance element. As a result, the variable resistance element changes from a high resistance state to a low resistance state. The operation of changing a variable resistance element from a high resistance state to a low resistance state is hereinafter referred to as the "set operation". On the other hand, data is erased from a memory cell MC by applying, for a long period of time, a certain voltage that is lower than that applied in the set operation to a variable resistance element in its low resistance state after the set operation. As a result, the variable resistance element changes from a low resistance state to a high resistance state. The operation of changing a variable resistance element from a low resistance state to a high resistance state is hereinafter referred to as the "reset operation". For example, a memory cell takes a high resistance state as a stable state (reset state). Data is written to the memory cell by such a set operation that causes a reset state to be switched to a low resistance state and data is erased from the memory cell by such a reset operation that causes a set state to be switched to a high resistance state for binary storage.

It is necessary to flow a current of several μA to change a selected memory cell from the low resistance state to the high resistance state in the reset operation. Although the current flows to a selected word line and a selected bit line, since a wiring resistance of these wirings is about several tens of KΩ, a voltage drop (IR drop) due to the wiring resistance cannot be ignored. When a voltage drop due to a parasitic resistance of overall paths including wiring contacts to which a reset current flows is taken into consideration, it is necessary to apply a voltage, which is larger than a certain voltage necessary for the reset operation of the variable resistor element, to a selected bit line to which the selected memory cell is connected. With this operation, even if the voltage drop due to the parasitic resistance occurs, a desired voltage and the reset current can be supplied to the selected memory cell.

When the selected memory cell is changed from the low resistance state to the high resistance state by the reset operation, a current, which flows to the wirings including the selected word line, the selected bit line and the wiring contacts, abruptly decreases in turn. Accordingly, a voltage drop due to the parasitic resistance of the wirings almost disappears in turn. As a result, there is a possibility that a voltage, which exceeds the certain voltage necessary for the reset operation and is as high as a set voltage, is applied to the selected memory cell placed in the high resistance state and a so-called erroneous set operation, in which the memory cell is subjected to the set operation by mistake after the completion of the reset operation, may be generated.

SUMMARY OF THE INVENTION

One aspect of the present invention provides a semiconductor storage device comprising: a cell array including a plurality of first wirings, a plurality of second wirings intersecting the first wirings, and memory cells positioned at intersecting portions between the first wirings and the second wirings, each of the memory cells having a series circuit of a non-ohmic element and a variable resistance element; a control circuit configured to apply a control voltage, which is necessary for the variable resistance element to transit from a low resistance state to a high resistance state, to the memory cells through the first wirings and the second wirings; and a bias voltage application circuit configured to apply a bias voltage, which suppresses a potential variation caused by the transition of the variable resistance element from the low resistance state to the high resistance state, to one end of the variable resistance element.

Another aspect of the present invention provides a semiconductor storage device comprising: a cell array including a plurality of first wirings, a plurality of second wirings intersecting the first wirings, and memory cells positioned at intersecting portions between the first wirings and the second wirings, each of the memory cells having a series circuit of a non-ohmic element and a variable resistance element; a control circuit configured to apply a control voltage, which is necessary for the variable resistance element to transit from a low resistance state to a high resistance state, to the memory cells through the first wirings and the second wirings; and a bias voltage application circuit configured to apply a bias voltage, which suppresses a potential variation caused by the transition of the variable resistance element from the low resistance state to the high resistance state, to one end of the variable resistance element, the bias voltage application circuit applying the bias voltage so that the voltage applied to the memory cells through the first wirings and the second wirings when the variable resistance element transits to the high resistance state is made smaller than a voltage necessary for the memory cells to transit from the high resistance state to the low resistance state.

Still another aspect of the present invention provides a semiconductor storage device comprising: a cell array including a plurality of first wirings, a plurality of second wirings intersecting the first wirings, and memory cells positioned at intersecting portions between the first wirings and the second wirings, each of the memory cells having a series circuit of a non-ohmic element and a variable resistance element; a control circuit configured to apply a control voltage, which is necessary for the variable resistance element to transit from a low resistance state to a high resistance state, to the memory cells through the first wirings and the second wirings; and a bias voltage application circuit configured to apply a bias voltage, which suppresses a potential variation caused by the transition of the variable resistance element from the low resistance state to the high resistance state, to one end of the variable resistance element, the bias voltage application circuit comprising: a dummy wiring intersecting the first or second wirings; dummy memory cells positioned at intersecting portions between the first or second wirings and the dummy wiring, each of the dummy memory cells having a resistance element having a resistance lower than that of the variable resistance element in the high resistance state; and a dummy wiring control circuit configured to apply a dummy wiring control voltage to the dummy memory cells through the dummy wiring when the control circuit applies the control voltage to the memory cells, and the bias voltage application circuit keeping the dummy wiring control voltage before and after transition of a resistance state of the variable resistance element.

DETAILED DESCRIPTION OF THE EMBODIMENTS

Embodiments of the present invention will now be described below with reference to the accompanying drawings. In the disclosed embodiments, a semiconductor storage device is described as a resistive memory device having a three-dimensional memory cell array structure with laminated memory cell arrays. Of course, this configuration, however, is intended to be exemplary only, and not a limitation upon the present invention.

[First Embodiment]

Figure 1:
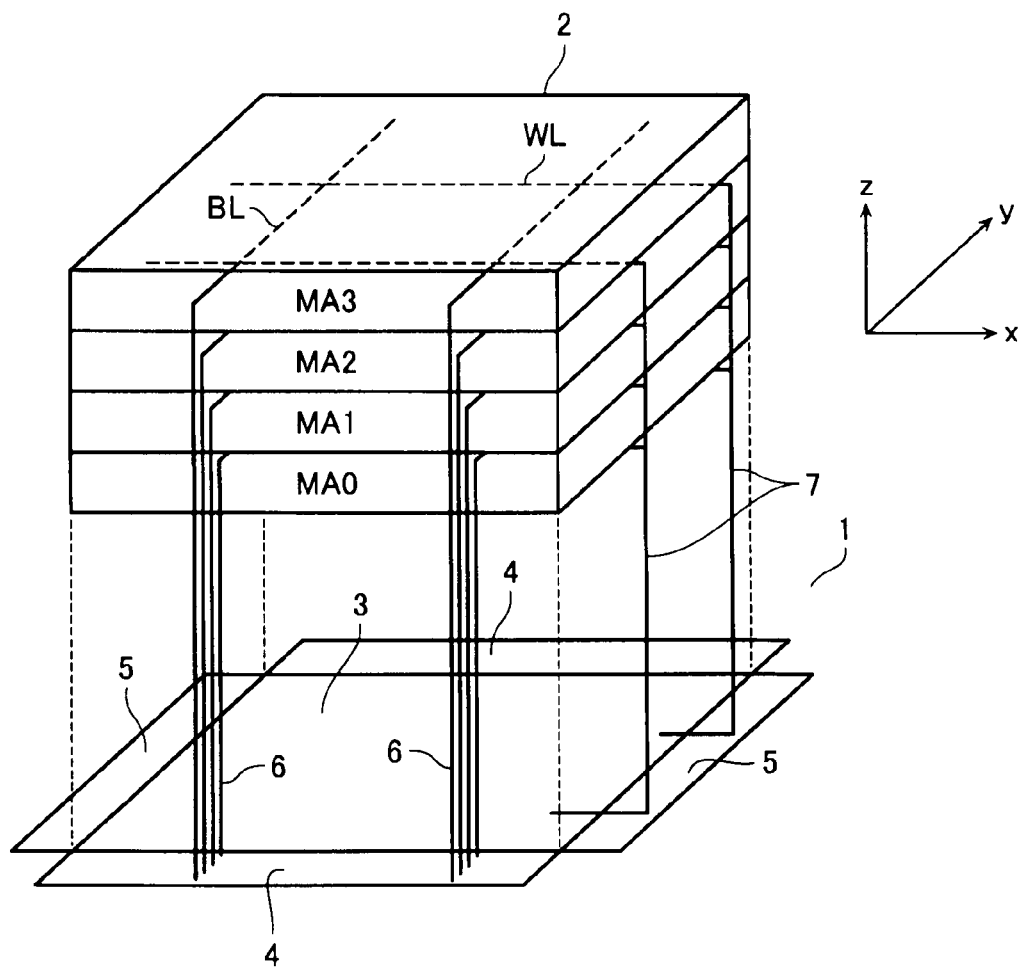
FIG. 1 is a perspective view illustrating a configuration of a resistive memory device according to a first embodiment.

FIG. 1 illustrates a basic configuration of a resistive memory device according to a first embodiment of the present invention, i.e., configuration of a wiring region 3, in which wirings such as global buses are formed on a semiconductor substrate 1, and a memory block 2 laminated thereon.

In the case of FIG. 1, the memory block 2 includes four layers of memory cell arrays MA0 to MA3. The wiring region 3 is provided on the semiconductor substrate 1 immediately below the memory block 2. The wiring region has, for example, global buses provided thereon for communicating data written to and read from the memory block 2 with the external. As described below, a column control circuit including a column switch, etc., and a row control circuit including a row decoder, etc., may also be provided on the wiring region 3.

It is necessary to provide vertical wirings (via contacts) on the side surface of the memory block 2 for connecting word lines WL and bit lines BL of the laminated memory cell arrays MA to the wiring region 3 formed on the semiconductor substrate 1. The wiring region 3 has bit-line contact regions 4 and word-line contact regions 5 provided on its four sides. The bit-line contact regions 4 and the word-line contact regions have bit-line contacts 6 and word-line contacts 7 formed therein for connecting the bit lines BL and the word lines WL to the control circuits. Each of the word lines WL is connected to the wiring region 3 via a respective word-line contact 7, one end of which is formed on one of the word-line contact regions 5. In addition, each of the bit lines BL is connected to the wiring region 3 via a respective bit-line contact 6, one end of which is formed on one of the bit-line contact regions 4.

Although FIG. 1 illustrates one memory block 2 with multiple memory cell arrays MA laminated therein in a direction perpendicular to the semiconductor substrate 1 (the z direction of FIG. 1), a plurality of such memory blocks 2 are, in fact, arranged in a matrix form in a direction in which the word line WL extends (the x direction of FIG. 1) as well as in a direction in which the bit lines BL extends (the y direction of FIG. 1).

As illustrated in FIG. 1, in the one word-line contact region 5 according to this embodiment, only one line of word-line contacts 7, i.e., those word lines WL in all layers of one cross section are connected to the wiring region 3 via respective common contacts. In addition, in the one bit-line contact region 4, the bit lines BL in each layer are connected to the wiring region 3 via four lines of contacts separately prepared for each layer. Although the bit lines BL are independently driven for each layer and the word lines WL are connected in common in all layers in this embodiment, the word lines WL may also be independently driven for each layer. Alternatively, the bit lines BL may also be connected in common and the word lines WL may be independently driven. Moreover, at least one of the bit lines BL and the word lines WL may be configured to be shared between the upper and lower layers.

Figure 2:
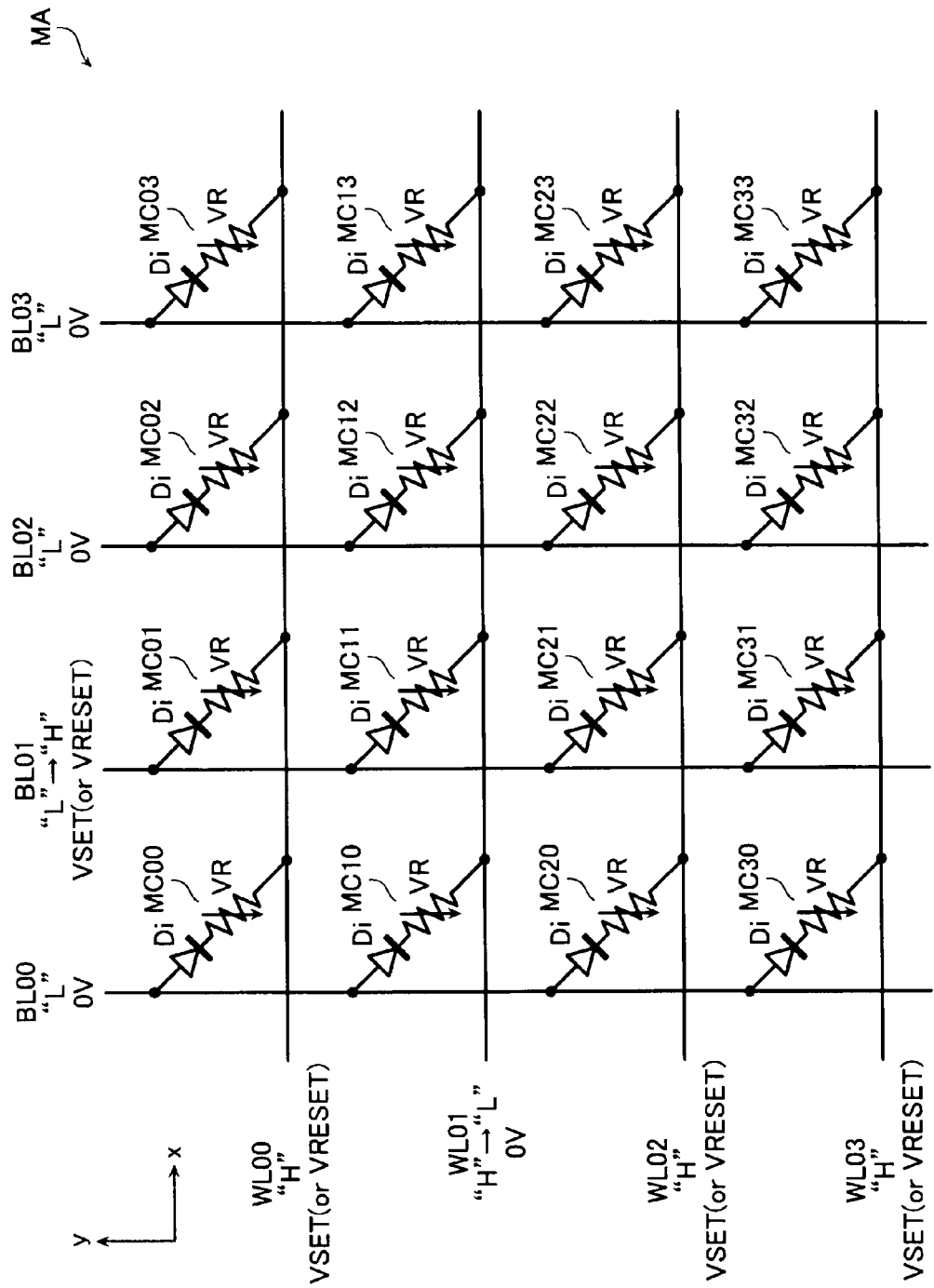
FIG. 2 is an equivalent circuit diagram of a memory cell array in the resistive memory device according to the first embodiment.

FIG. 2 is an equivalent circuit diagram of a memory cell array MA in the resistive memory device. In this case, the memory cell array MA illustrated in FIG. 2 has a plurality of unit memory cells MC arranged in a direction in which the bit lines BL extend (the y direction of FIG. 2) as well as in a direction in which the word lines WL extend (the x direction of FIG. 2), respectively, in a two dimensional matrix form. As can be seen, resistance-varying type unit memory cells MC are positioned at intersections between word lines WL and bit lines BL, with rectifier elements, e.g., diodes Di, and variable resistance elements VR connected in series. It should be appreciated that a diode Di and a variable resistance element VR included in a memory cell MC are not limited to the arrangement or polarity as illustrated in the figures.

The variable resistance elements VR, which have, for example, a structure of electrode/transition metal oxide (binary system or ternary system)/electrode, provide a change in resistance value of a metal oxide depending on the conditions of applied voltage, current, heat, etc., and store the different states of the resistance values as information in a non-volatile manner. More specifically, the following can be used as the variable resistance elements VR: changing resistance values with a phase transition between a crystalline state and an amorphous state, such as chalcogenide (PCRAM); changing resistance values by depositing metal cations to form a contacting bridge between electrodes, or ionizing the deposited metal to break down the contacting bridge (CBRAM: Conductive Bridging RAM); changing resistance values through application of voltage or current (ReRAM) (which is divided broadly into two types: one is the type where a resistance change occurs depending on the absence or presence of electric charges trapped by a charge trapping residing on the electrode interface; and the other is the type where a resistance change occurs depending on the absence or presence of a conductive path due to oxygen defect, etc.); and so on.

For unipolar-type ReRAM, data write to a memory cell MC, that is, set operation is performed by applying, for on the order of 10 ns to 100 ns, a voltage of, e.g., 1.5 V (in fact, on the order of 2.1 V if a voltage drop 0.6 V in the corresponding diode Di is included) and a current of on the order of 10 nA to a variable resistance element VR. As a result, the variable resistance element VR changes from a high resistance state to a low resistance state. As a factor of the above resistance change, there is considered, for example, a model in which when a high voltage is applied to the variable resistance element VR, internal cations (positive charge ions) move and a substance in an insulation state phase-changes to a series coupling state of electrochemically potentially (semi) stable conductive material. It is needless to say that there are considered other models because various models exist depending on substances.

On the other hand, data erase from a memory cell MC, that is, reset operation is performed by applying, for on the order of 500 ns to 2 µs, a voltage of 0.6 V (in fact, on the order of 1.6 V if a voltage drop 1.0 V in the corresponding diode Di is included) and a current of on the order of 1 µA to 10 µA to a variable resistance element VR in its low resistance state after the set operation. As a result, the variable resistance element VR changes from a low resistance state to a high resistance state. As a factor of the above resistance change, there is considered a model, for example, in which atoms are thermally diffused by Joule heat generated in the variable resistance element VR and change to an original thermal equilibrium state.

For example, a memory cell MC takes a high resistance state as a stable state (reset state). Data is written to the memory cell MC by such a set operation that causes a reset state to be switched to a low resistance state and data is erased from the memory cell MC by such a reset operation that causes a set state to be switched to a high resistance state for binary storage.

A read operation from a memory cell MC is performed by applying a voltage of 0.4 V (in fact, on the order of 1.2 V if a voltage drop 0.8 V in the corresponding diode Di is included) to a variable resistance element VR, and monitoring a current flowing through the variable resistance element VR. As a result, it is determined whether the variable resistance element VR is in its low resistance or high resistance state.

Referring again to FIG. 2, the set operation and reset operation of the resistive memory device according to this embodiment will be described below. FIG. 2 illustrates the states of voltage applied to the bit lines BL and the word lines WL connected to a memory cell array MA in the set operation and the reset operation of a memory cell MC. In this case, given that the selected memory cell MC to which data is to be written by the set operation and the reset operation is MC11.

Non-selected bit lines BL00, BL02, and BL03 that are not connected to the selected memory cell MC11 are in "L" state (in this embodiment, Vss=0 V). During the set operation, the selected bit line BL01 that is connected to the selected memory cell MC11 is driven from "L" state (Vss=0 V) to "H" state (in this embodiment, voltage VSET). In addition, non-selected word lines WL00, WL02, and WL03 that are not connected to the selected memory cell MC11 are in "H" state (in this embodiment, voltage VSET). During the set operation, the selected word line WL01 that is connected to the selected memory cell MC11 is driven from the "H" state (voltage VSET) to "L" state (in this embodiment, voltage Vss=0 V). As a result, the diode Di in the selected memory cell MC11 is turned to a forward-biased state, which causes current to flow therethrough. Then a potential difference VSET is applied to the selected memory cell MC11 and the corresponding variable resistance element VR changes from a high resistance state to a low resistance state, after which the set operation is completed.

Further, the reset operation of the resistive memory device according to the embodiment is carried out by setting a voltage applied to the selected bit line BL01 and the non-selected word lines WL00, WL02, WL03 shown in FIG. 2 to a reset voltage VRESET.

Figure 3B:
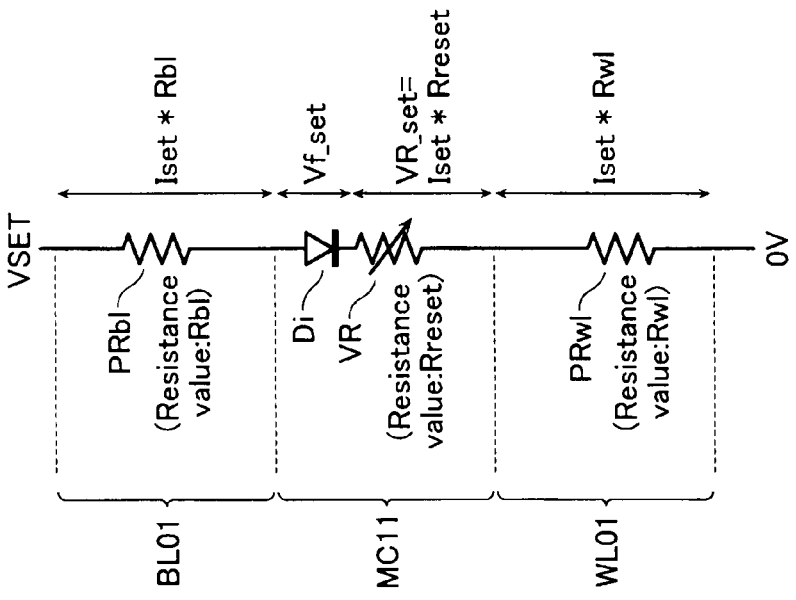
FIG. 3B is a view for explaining a voltage drop in the respective operations of the resistive memory device according to the first embodiment.
Figure 3A:
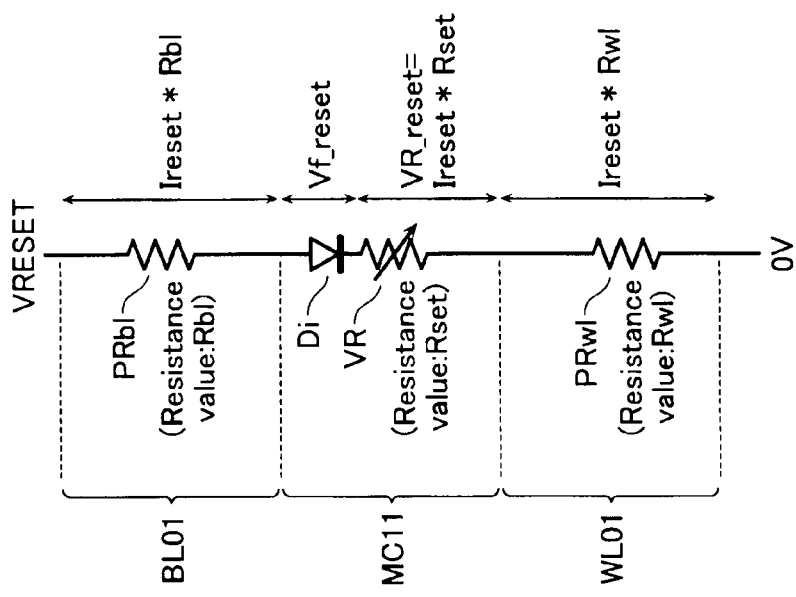
FIG. 3A is a view for explaining a voltage drop in the respective operations of the resistive memory device according to the first embodiment.

Next, a condition by which an erroneous set operation is generated after the reset operation of the resistive memory device will be explained referring to FIGS. 3A and 3B. FIGS. 3A and 3B are views for explaining a voltage drop in the reset operation and the set operation of the resistive memory device. FIGS. 3A and 3B show the selected bit line BL01, the selected memory cell MC11, and the selected word line WL01 in the memory cell array MA shown in FIG. 2 by simplifying the configurations thereof.

States of a voltage and a current applied to the bit lines BL and the word lines WL connected to the memory cell array MA in the reset operation of the memory cell MC are shown in FIG. 3A.

In the reset operation, the selected bit line BL01 connected to the selected memory cell MC11 is driven to the "H" state (voltage VRESET in the embodiment), and the selected word line WL01 is driven to the "L" state (voltage Vss=0 V in the embodiment). The diode Di of the selected memory cell MC11 is placed in the forward bias state by applying the voltage to the selected bit line BL01, and a reset current Ireset, by which the reset operation can be carried out, flows to the selected memory cell MC11. A value of a voltage (element-application-reset-voltage VR_reset) capable of changing the variable resistance element VR of the memory cell MC from the low resistance state to the high resistance state is a value Ireset*Rset obtained by multiplying a resistance value Rset of the variable resistance element VR in the set state (the low resistance state) by the reset current Ireset.

Voltage drops caused by a parasitic resistance PRbl of the bit lines BL, a parasitic resistance PRwl of the word lines WL, and the diodes Di will be examined here. The voltage drop caused by the parasitic resistance PRbl (resistance value Rbl) of the bit lines BL is determined by a product of the resistance value Rbl and the current Ireset flowing thereto. A value of the voltage drop caused by the parasitic resistance PRbl of the bit lines BL is Ireset*Rbl. Further, the voltage drop caused by the parasitic resistance PRwl (resistance value Rwl) of the word lines WL is determined by a product of the resistance value Rwl and the current Ireset flowing thereto. A value of the voltage drop caused by the parasitic resistance PRwl of the word lines WL is Ireset*Rwl. A value of the voltage drop caused by the diodes Di in the reset operation is Vf_reset. Accordingly, a value of a voltage drop when the reset voltage is applied to the selected memory cell MC11 is Ireset*(Rbl+Rwl)+Vf_reset.

As shown in Expression 1, the reset voltage VRESET applied to the bit line BL01 is a sum of the element-application-reset-voltage VR_reset (=Ireset*Rset) necessary for the reset operation and a value of a voltage drop Ireset*(Rbl+Rwl)+Vf_reset when the reset voltage is applied to the selected memory cell MC11.

[Expression 1]

$$VRESET = VR\_reset + Ireset*(Rbl+Rwl) + Vf\_reset \qquad (1)$$

The variable resistance element VR changes from the low resistance state to the high resistance state by the reset voltage VRESET and the reset current Ireset, and the reset operation is completed.

States of a voltage and a current applied to the bit lines BL and the word lines WL connected to the memory cell arrays MA in the set operation of the memory cell MC are shown in FIG. 3B.

In the set operation, the selected bit line BL01 connected to the selected memory cell MC11 is driven to the "H" state (voltage VSET in the embodiment), and the selected word line WL01 is driven to the "L" state (voltage Vss=0 V in the embodiment). When a voltage is applied to the selected bit line BL01, the diode Di of the selected memory cell MC11 is placed in the forward bias state, and a set current Iset capable of carrying out the set operation flows to the selected memory cell MC11. A value of a voltage (element-application-set-voltage VR_set) capable of changing the variable resistance element VR of the memory cell MC from the high resistance state to the low resistance state is a value Iset*Rreset obtained by multiplying a resistance value Rreset of the variable resistance element VR in the reset state (the high resistance state) by the set current Iset.

Voltage drops caused by the parasitic resistance PRbl of the bit lines BL, the parasitic resistance PRwl of the word lines WL, and the diode Di will be examined here. The voltage drop caused by the parasitic resistance PRbl (resistance value Rbl) of the bit lines BL is determined by a product of the resistance value Rbl and the current Iset flowing thereto. A value of the voltage drop caused by the parasitic resistance PRbl of the bit lines BL is Iset*Rbl. Further, the voltage drop caused by the parasitic resistance PRwl (resistance value Rwl) of the word lines WL is determined by a product of the resistance value Rwl and the current Iset flowing thereto. A value of the voltage drop caused by the parasitic resistance PRwl of the word lines WL is Iset*Rwl. A value of the voltage drop caused by diode Di in the set operation is Vf_set. Accordingly, a value of a voltage drop when the set voltage is applied to the selected memory cell MC11 is Iset*(Rbl+Rwl)+Vf_set.

As shown in Expression 2, the set voltage VSET applied to the bit line BL01 is a sum of the element-application-set-voltage VR_set (=Iset*Rreset) necessary for the set operation and a value of a voltage drop Iset*(Rbl+Rwl)+Vf_set when the set voltage is applied to the selected memory cell MC11.

[Expression 2]

$$VSET = VR\_set + Iset*(Rbl+Rwl) + Vf\_set \qquad (2)$$

The variable resistance element VR changes from the high resistance state to the low resistance state by the set voltage VSET and the set current Iset, and the set operation is completed.

The following condition is necessary to prevent the erroneous set operation from being generated to the selected memory cell MC11 which changes to the high resistance state in the reset operation.

[Expression 3]

$$VRESET < VSET \qquad (3)$$

VR_reset=0.6 V, VR_set=1.5 V, Vf_reset=1.0 V, Vf_set=0.6 V, Ireset=10 μA, Iset=1 nA, Rbl+Rwl=several tens of KΩ are assumed as an operating condition. These values are substituted for the expressions (1) and (2). At this time, since the term of Iset*(Rbl+Rwl) in the expression (2) is small enough to be ignored, the following expressions are obtained.

$$VRESET=1.6\ V+Ireset*(Rbl+Rwl)$$

$$VSET=2.1\ V \qquad \text{[Expression 4]}$$

When the above expressions are substituted for the expression (3), an expression 5 is obtained.

[Expression 5]

$$Ireset*(Rbl+Rwl)<0.5\ V \qquad (5)$$

That is, unless a wiring resistance is small to such a degree that the condition of Expression 5 is satisfied, the erroneous set operation is generated after the reset operation. To prevent the erroneous set operation after the reset operation, it is necessary to suppress the voltage drop caused by a parasitic resistance of the wirings. However, as circuits in the resistive memory device are miniaturized, since it becomes difficult to suppress the parasitic resistance of the wirings to a low level, there is a possibility that the erroneous set operation is generated. The resistive memory device according to the embodiment effectively prevents the generation of the erroneous set operation.

Figure 4A:
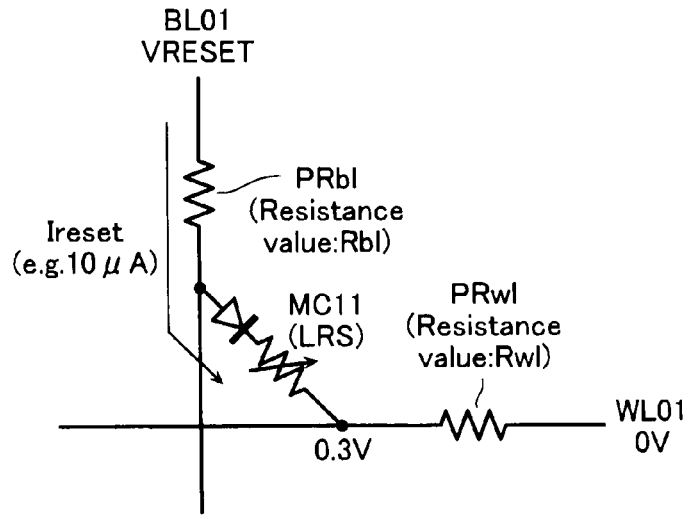
FIG. 4A is a view for explaining a voltage drop in a reset operation of a resistive memory device of a comparative example.
Figure 4B:
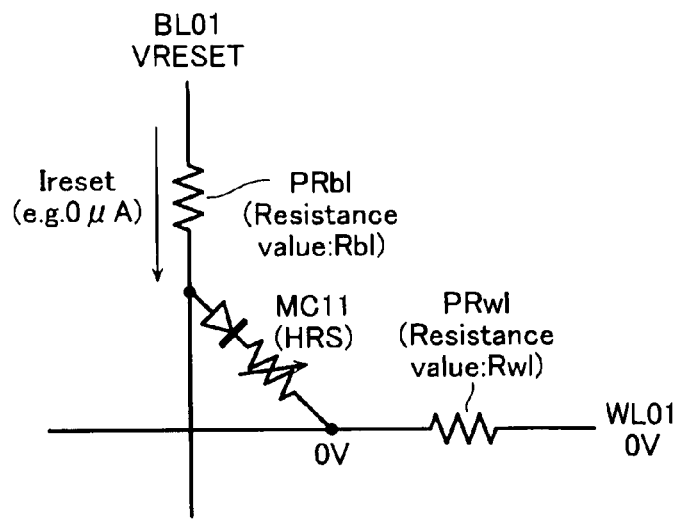
FIG. 4B is a view for explaining a voltage drop in the reset operation of the resistive memory device of the comparative example.

An example of the erroneous set operation caused by a voltage drop due to the wiring resistance will be explained below using a resistive memory device of a comparative example. FIGS. 4A and 4B are views for explaining voltage drops in the reset operation of the resistive memory device of the comparative example.

As shown in FIG. 4A, in the reset operation, the reset current Ireset flows from a selected bit line BL01 to a selected word line WL01 through a selected memory cell MC11 in the low resistance state. The reset voltage VRESET applied to the selected bit line BL01 is dropped through the parasitic resistance PRbl of the bit lines BL and the selected memory cell MC11 in the low resistance state. Accordingly, a voltage of a portion where the selected memory cell MC11 is connected to the selected word line WL01 is about 0.3 V. The voltage is dropped by the parasitic resistance PRwl of the word lines WL, and a final potential of the selected word line WL01 becomes 0 V.

Next, as shown in FIG. 4B, when the selected memory cell MC11 is placed in the high resistance state by the reset operation, almost no reset current Ireset flows to the selected memory cell MC11. In this case, no voltage drop occurs by the parasitic resistances PRbl, PRwl of the wirings, and the reset voltage VRESET applied to the selected bit line BL01 is applied to the selected memory cell MC11 as it is. When the parasitic resistance of the wirings exceeds an upper limit prescribed by Expression 5 described above, the reset voltage VRESET applied to the selected memory cell MC11 exceeds a voltage necessary for the set operation of the selected memory cell. As a result, the erroneous set operation is generated.

Figure 5A:
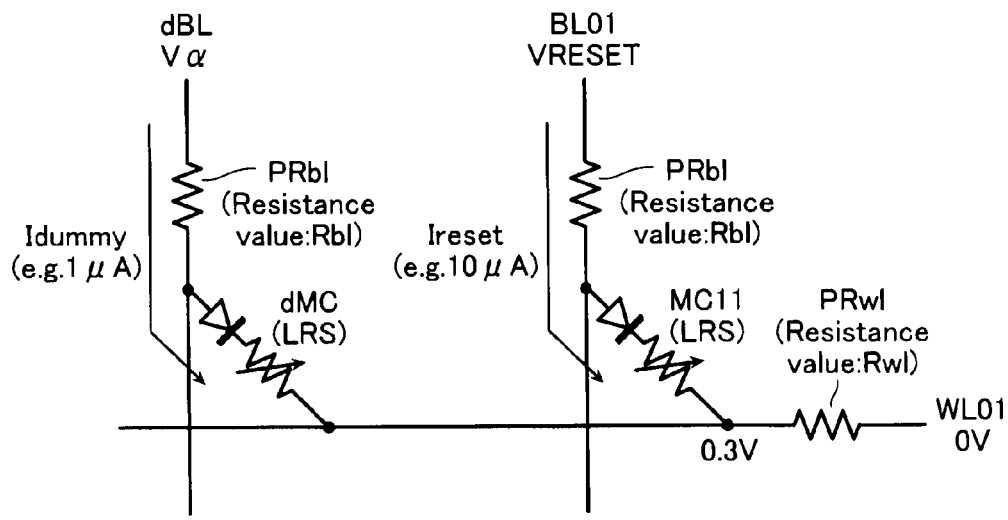
FIG. 5A is a view for explaining a voltage drop in the reset operation of the resistive memory device according to the first embodiment.
Figure 5B:
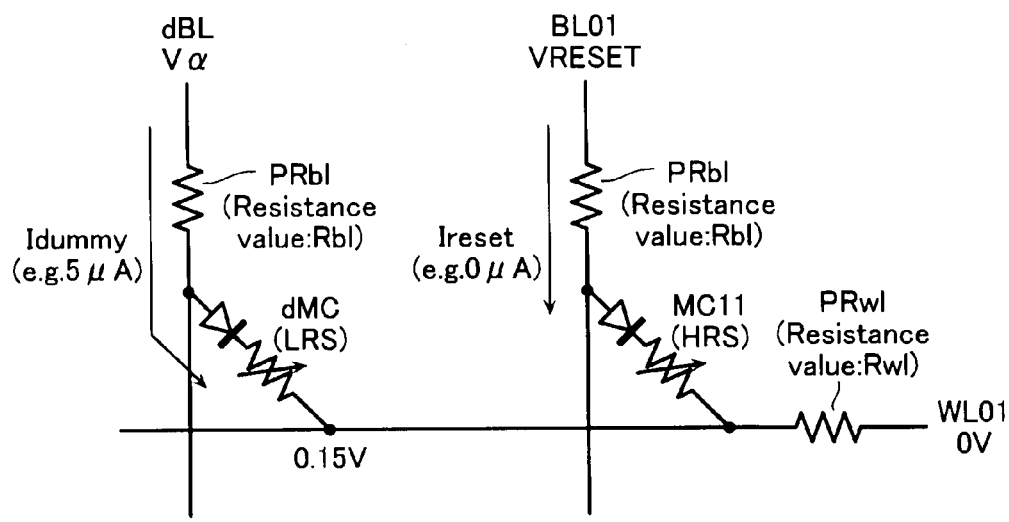
FIG. 5B is a view for explaining a voltage drop in the reset operation of the resistive memory device according to the first embodiment.

Next, the reset operation of the resistive memory device according to the embodiment will be explained referring to FIGS. 5A and 5B. FIGS. 5A and 5B are views for explaining voltage drops in the reset operation of the resistive memory device of the embodiment.

As shown in FIG. 5A, a dummy bit line dBL is disposed in the memory cell array MA of the embodiment in addition to the bit lines BL. A dummy memory cell dMC composed of a rectifier element and a resistance element is connected to an intersecting portion between the dummy bit line dBL and a word line WL. A memory cell having substantially the same resistance value as that of the low resistance state of the memory cell MC is used as the dummy memory cell dMC. A memory cell, for example, which is permanently placed in the low resistance state by breaking a variable resistance element VR by applying a voltage higher than that in the set operation to an ordinary memory cell MC, can be used as the dummy memory cell dMC.

As shown in FIG. 5A, the reset current Ireset flows from the selected bit line BL01 to the selected word line WL01 through the selected memory cell MC11 in the low resistance state also in the reset operation of the resistive memory device according to the embodiment. Further, a certain voltage Vα lower than the reset voltage VRESET is applied to the dummy bit line dBL. Accordingly, a dummy current Idummy flows from the dummy bit line dBL to the selected word line WL01 through the dummy memory cell dMC in the low resistance state. The reset voltage VRESET applied to the selected bit line BL01 is dropped through the parasitic resistance PRbl of the bit lines BL and the selected memory cell MC11 in the low resistance state. Accordingly, a voltage of a portion where the selected memory cell MC11 is connected to the selected word line WL01 is about 0.3 V. The voltage is dropped by the parasitic resistance PRwl of the word lines WL, and the final potential of the selected word line WL01 becomes 0 V. The voltage Vα applied to the dummy bit line dBL is smaller than the reset voltage, and the voltage of the portion where the selected memory cell MC11 is connected to the word line WL01 is about 0.3 V. Accordingly, a value of the dummy current Idummy flowing to the dummy memory cell dMC becomes a value smaller than that of the reset current Ireset.

Next, as shown in FIG. 5B, when the selected memory cell MC11 is placed in the high resistance state by the reset operation, almost no reset current Ireset flows to the selected memory cell MC11. In contrast, since the dummy memory cell dMC is permanently in the low resistance state, the dummy current Idummy continuously flows even after the reset current IRESET stops flowing. Since the potential of the selected word line WL01 is not increased by the reset voltage VRESET applied to the selected bit line BL01, the dummy current Idummy flows more easily than before the selected memory cell MC11 is placed in the high resistance state. The voltage Vα applied to the dummy bit line dBL is dropped through a parasitic resistance PRbl of the dummy bit line dBL and the dummy memory cell dMC in the low resistance state, and a voltage of a portion where the dummy memory cell dMC is connected to the selected word line WL01 is about 0.15 V. The voltage is dropped by the parasitic resistance PRwl of the word lines WL, and the final potential of the selected word line WL01 becomes 0 V.

In the reset operation of the embodiment, a voltage applied to the selected memory cell MC11 whose reset operation is finished is a voltage obtained by subtracting an increased voltage 0.15 V of the word line WL01 from the reset voltage VRESET applied to the selected bit line BL01. Accordingly, the voltage applied to the selected memory cell MC11 is more eased than the reset voltage VRESET applied to the selected bit line BL01 and does not exceed the set voltage VSET having a possibility of generating the erroneous set operation. According to the resistive memory device of the embodiment, generation of the erroneous set operation after the reset operation can be prevented.

Figure 6:
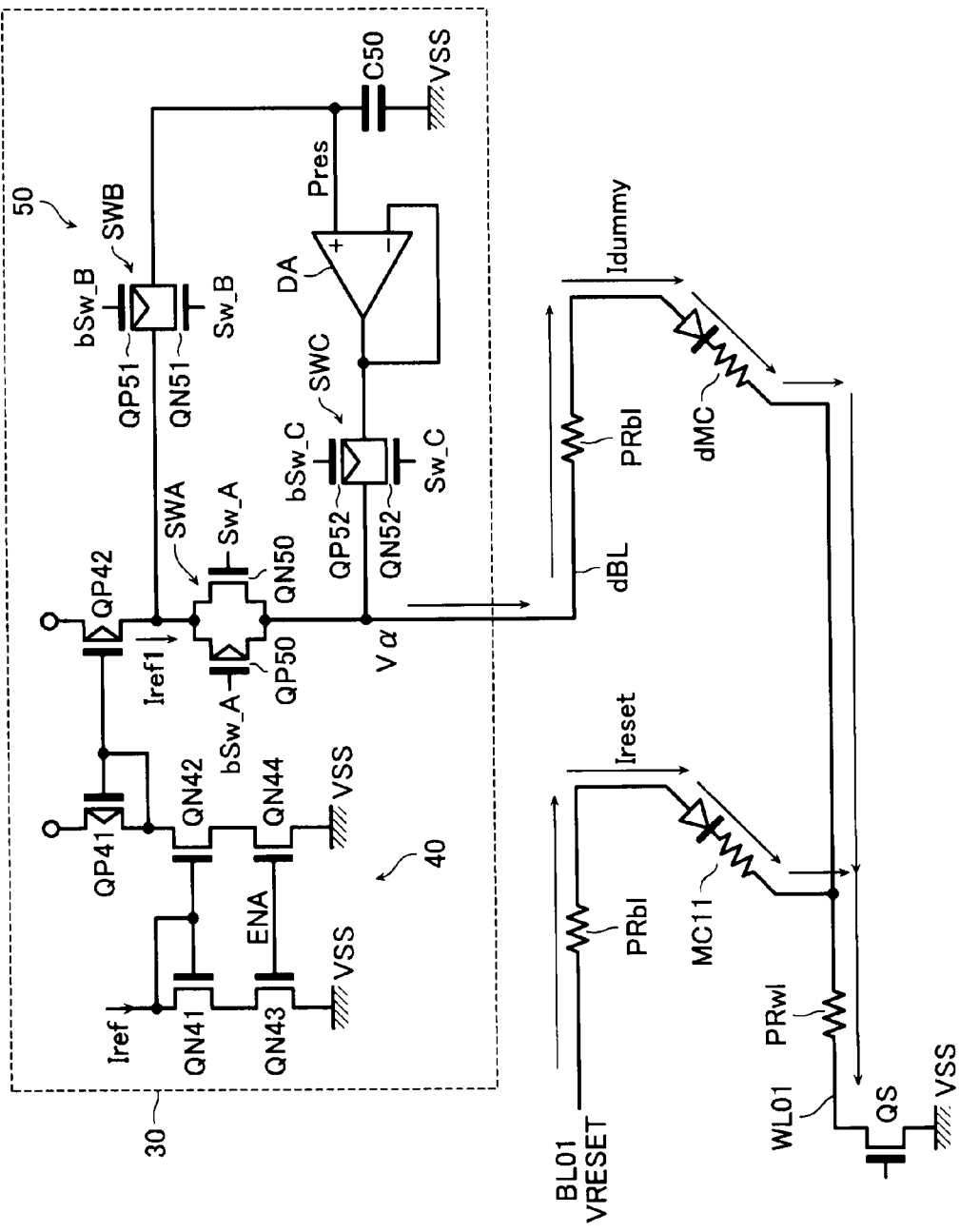
FIG. 6 is a circuit diagram showing a configuration example of a dummy bit line control circuit in the resistive memory device according to the first embodiment.

Next, a circuit configuration of the resistive memory device which applies the voltage Vα to the dummy bit line dBL in the reset operation will be explained referring to FIG. 6. FIG. 6 is a circuit diagram showing a configuration example of a dummy bit line control circuit 30 as an aspect of a bias voltage application circuit of the resistive memory device. The dummy bit line control circuit 30 is a control circuit which continuously applies the certain voltage Vα to the dummy bit line dBL even if the dummy current Idummy is varied by the reset operation of the selected memory cell MC11. Even if a resistance state of the selected memory cell MC11 transits to the high resistance state, a potential variation of the selected word line WL01 can be suppressed by the bias voltage Vα. The reset voltage VRESET is applied to the selected bid line BL01, and a ground voltage VSS is applied to the selected word line WL01 through a switch transistor QS, respectively.

[Configuration of Dummy Bit Line Control Circuit 30]

As shown in FIG. 6, the dummy bit line control circuit 30 is connected to the dummy bit line dBL. The dummy bit line control circuit 30 includes a constant current circuit 40 for outputting a constant current Iref1 and a voltage sampling circuit 50 for sampling the certain voltage Vα based on the constant current Iref1 output from the constant current circuit 40 and applying the sampled certain voltage Vα to the dummy bit line dBL. Further, the dummy bit line control circuit 30 includes a differential amplifier DA for keeping a potential of the dummy bit line dBL sampled in the voltage sampling circuit 50 during the period of the reset operation of the selected memory cell MC11.

The constant current circuit 40 includes NMOS transistors QN41, QN42 constituting a current mirror pair and NMOS transistors QN43, QN44 connected in series to the transistors QN41, QN42 for activating a circuit. Further, the constant current circuit 40 includes PMOS transistors QP41, QP42 which constitute a current mirror output circuit for outputting the constant current Iref1 by receiving an output from the current mirror pair.

The voltage sampling circuit 50 includes a switch SWA composed of an NMOS transistor QN50 and a PMOS transistor QP50, a switch SWB composed of an NMOS transistor QN51 and a PMOS transistor QP51, and a switch SWC composed of an NMOS transistor QN52 and a PMOS transistor QP52. Switching signals Sw_A to Sw_C and bSw_A to bSw_C are input to gates of the NMOS transistors QN50 to QN52 and gates of the PMOS transistors QP50 to QP52, respectively. Input terminals of the switches SWA and SWB are connected in parallel with an output terminal of the constant current circuit 40 from which the constant current Iref1 is output. An output terminal of the switch SWA is connected to the dummy bit line dBL. An output terminal of the switch SWB is connected to one terminal of a capacitor C50, and the ground voltage Vss is applied to the other terminal of the capacitor C50.

Further, the one terminal of the capacitor C50 is connected also to a non-inverted input terminal Pres of the differential amplifier DA. An output terminal of the differential amplifier DA is connected to the switch SWC as well as feedback connected to an inverted input terminal. An output terminal of the switch SWC is connected to the dummy bit line dBL.

[Operation of Dummy Bit Line Control Circuit 30]

An operation of the dummy bit line control circuit 30 configured as described above will be explained. When the reset operation starts and a current Iref is input to the constant current circuit 40, the constant current Iref1 is output through the NMOS transistors QN41, QN42 and the current mirror output circuit. At this time, the switching signals Sw_A, Sw_B are set to a "H" level, and the switching signals bSw_A, bSw_B are set to a "L" level to thereby turn on the switches SWA, SWB so that they are placed in a conductive state. Further, the switching signal Sw_C is set to the "L" level and the switching signal bSw_C is set to the "H" level to thereby turn off the switch SWC so that it is placed in a non-conductive state. With this operation, a dummy current Idummy (for example, about 1 μA), which can apply the certain voltage Vα to the dummy bit line dBL is flowed to the dummy memory cells dMC as well as charges based on the certain voltage Vα are stored in the capacitor C50. The certain voltage Vα of the dummy bit line dBL just after the constant current is supplied to the dummy bit line dBL is sampled by the capacitor C50, whereby an input voltage to the non-inverted input terminal Pres of the differential amplifier DA is determined.

Next, the switching signal Sw_B is set to the "L" level and the switching signal bSw_B is set to the "H" level to thereby turn off the switch SWB so that it is placed in the non-conductive state as well as the switching signal Sw_C is set to the "H" level and the switching signal bSw_C is set to the "L" level to thereby turn on the switch SWC so that it is placed in the conductive state. Thereafter, a voltage of the dummy bit line dBL is kept to the certain voltage Vα by the differential amplifier DA. Even if the selected memory cell MC11 is placed in the high resistance state after the reset operation, the dummy current Idummy increases and the certain voltage Vα is continuously applied to the dummy bit line dBL. As described above, when the voltage Vα is continuously applied to the dummy bit line dBL to which the dummy memory cells dMC are connected, a voltage drop occurs by the dummy current Idummy and the parasitic resistance PRwl of the word line WL01 and a voltage of a connection end of the word line WL01 side of the memory cell MC11 more increases than the ground voltage VSS. As a result, generation of the erroneous set operation after the reset operation can be prevented.

The certain voltage Vα, which is applied to the dummy bit line dBL by the dummy bit line control circuit 30, can be set larger than a voltage obtained by subtracting the element-application-set-voltage VR_set necessary for setting the selected memory cell MC11 from the reset voltage VRESET applied to the selected bit line BL01. As a result, a voltage applied to the selected memory cell MC11 after the reset operation can be securely made smaller than the element-application-set-voltage VR_set by which the erroneous set operation may be generated.

[Configuration of Control Circuit]

Figure 7:
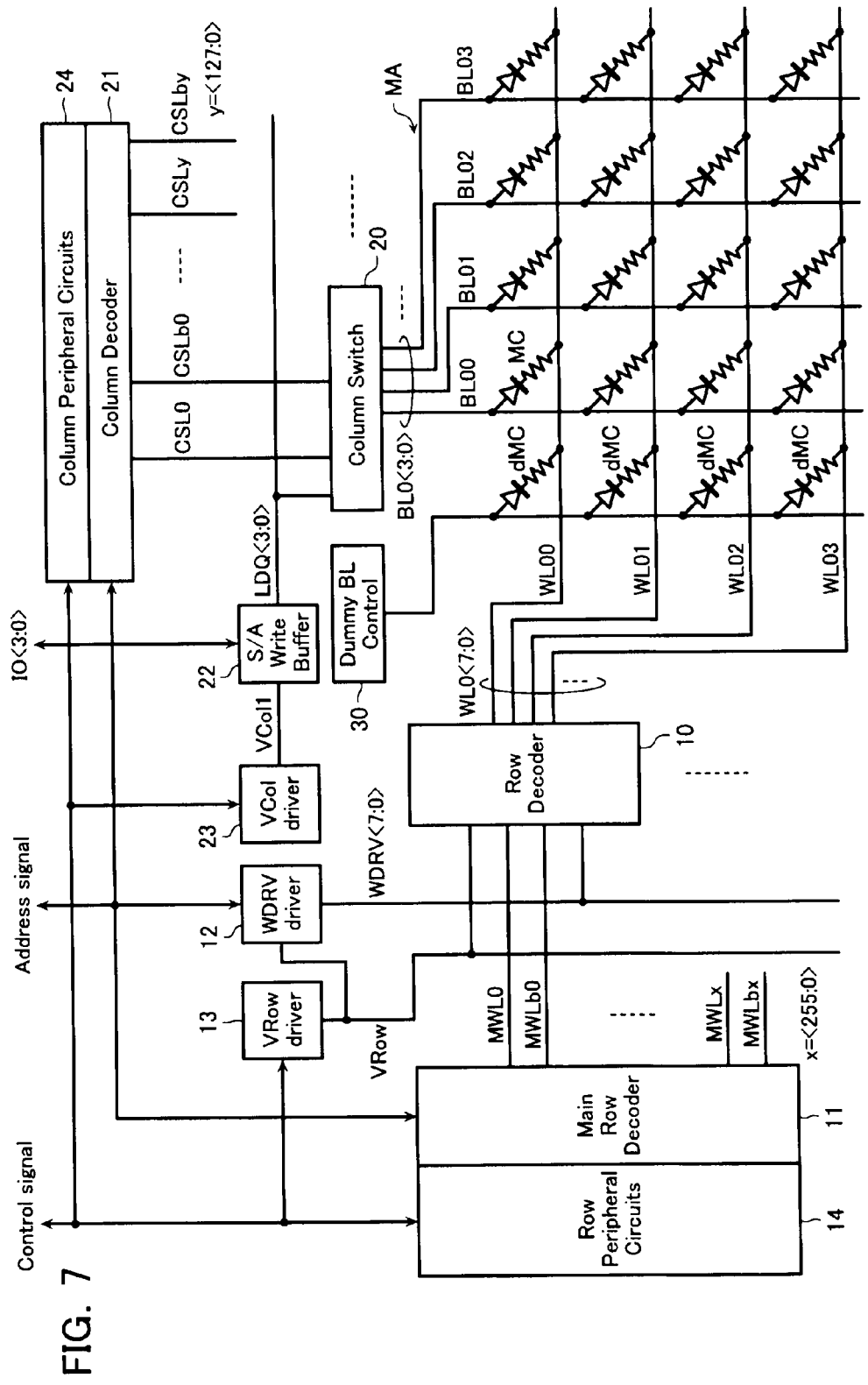
FIG. 7 is a block diagram illustrating an example arrangement of column/row control circuits in the resistive memory device according to the first embodiment.

A circuit configuration of the resistive memory device to apply the reset voltage VRESET to the bit line BL01 and the voltage Vss to the word line WL01 will be described with reference to FIGS. 7 to 15. The case in which 2K-bit (2048-bit) memory cells MC are arranged in the direction of the word line, 512-bit memory cells MC are arranged in the direction of the bit line, and 1 M-bit memory cells MC are arranged in the one memory cell array MA will be described by way of example. FIG. 7 is a block diagram illustrating an example of the arrangement of a column control circuit and a row control circuit in the resistive memory device.

Referring to FIG. 7, the row control circuit includes a row decoder 10, a main row decoder 11, a write drive line driver 12, a row power supply line driver 13, and a row-system peripheral circuit 14. The column control circuit includes a column switch 20, a column decoder 21, a sense amplifier/write buffer 22, a column power supply line driver 23, and a column-system peripheral circuit 24.

The word line WL of the embodiment has a hierarchical structure, and the main row decoder 11 selectively drives one of 256 pairs of main word lines MWLx and MWLbx (x=<255:0>). For example, in the selected main word lines MWLx and MWLbx, the main word line MWLx becomes the "H" state and the main word line MWLbx becomes the "L" state. On the contrary, in the non-selected main word lines MWLx and MWLbx, the main word line MWLx becomes the "L" state and the main word line MWLbx becomes the "H"

state. One pair of main word lines MWLx and MWLbx is connected to one row decoder 10. The row decoder 10 selectively drives one of eight word lines WL included in a group of word line WLx<7:0>. The group of word line WLx<7:0> is located under the hierarchy of the main word lines MWLx and MWLbx. The row decoder 10 connected to the main word lines MWLx and MWLbx selectively driven by the main row decoder 11 further selectively drives the word line WL, thereby selectively driving one word line WL.

Eight write drive lines WDRV<7:0> and row power supply line VRow are connected to the write drive line driver 12, and the row power supply line VRow is connected to the row power supply line driver 13. The write drive lines WDRV<7:0> and the row power supply line VRow are connected to the row decoder 10. The voltage is applied to the write drive line WDRV<7:0> and the row power supply line VRow in order that the row decoder 10 drives the word line WL. Specifically, during the reset operation, the voltage Vss (=0 V) is supplied to one write drive line WDRV corresponding to the selected word line WL in the eight write drive lines WDRV<7:0>, and the voltage VRESET is supplied to other write drive lines WDRV of the write drive lines WDRV<7:0>. The voltage (VRESET) supplied to the word line WL under the hierarchy of the non-selected main word line MWL and MWLbx is applied to the row power supply line VRow. The row-system peripheral circuit 14 manages the whole of the resistive memory device. The row-system peripheral circuit 14 receives a control signal from an external host apparatus, the row-system peripheral circuit 14 reads, write, and erases the data, and the row-system peripheral circuit 14 performs data input and output management.

The bit line BL of the embodiment also has the hierarchical structure, and the column decoder 21 selectively drives one of pairs of column selection lines CSLy and CSLby in 128 pairs of column selection lines CSLy and CSLby (y=<127:0>). For example, in the selected column selection lines CSLy and CSLby, the column selection line CSLy becomes the "H" state and the column selection line CSLby becomes the state. On the contrary, in the non-selected column selection lines CSLy and CSLby, the column selection line CSLy becomes the "L" state and the column selection line CSLby becomes the "H" state. One pair of column selection lines CSLy and CSLby is connected to one column switch 20. The column switch 20 selectively drives one of bit line including a group of bit line BLy<3:0> comprising four bit lines BL located under the hierarchy of the column selection lines CSLy and CSLby. The column switch 20 that is connected to the column selection lines CSLy and CSLby selectively driven by the column decoder 21 further selectively drives the bit line BL, thereby selectively driving the bit line BL.

Four local data lines LDQ<3:0> are connected to the sense amplifier/write buffer 22. The local data lines LDQ<3:0> are connected to the column switch 20. The sense amplifier/write buffer 22 detects and amplifies signals read on the local data lines LDQ<3:0>, and the sense amplifier/write buffer 22 supplies the write data fed from data input and output lines IO<3:0> to the memory cell MC through the column switch 20. The voltage is applied to the local data line LDQ<3:0> in order that the column switch 20 drives the bit line BL. Specifically, voltage VRESET is supplied to four local data lines LDQ<3:0> in the reset operation. The column power supply line driver 23 is connected to the sense amplifier/write buffer 22 through a column power supply line VCol1. The column-system peripheral circuit 24 manages the whole of the resistive memory device. The column-system peripheral circuit 24 receives a control signal from an external host apparatus, the column-system peripheral circuit 24 reads, write, and erases the data, and the column-system peripheral circuit 24 performs data input and output management.

The detailed configuration of the row control circuit will be described with reference to FIGS. 8 to 11. FIGS. 8 to 11 are circuit diagrams illustrating an example of the configuration of the row control circuit in the resistive memory device.

[Configuration of Row Decoder 10]

Figure 8:
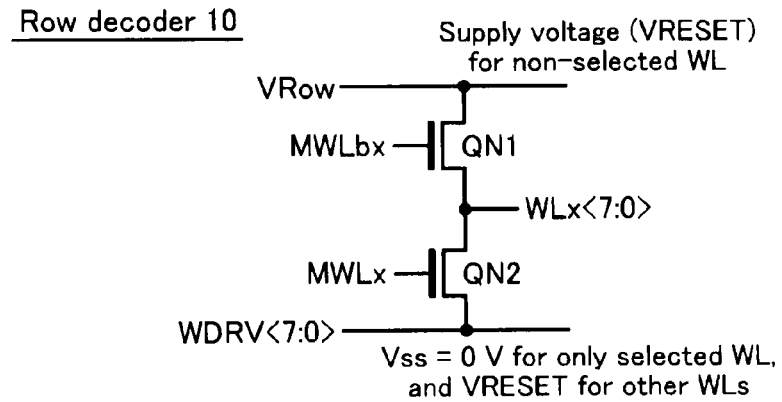
FIG. 8 is a circuit diagram illustrating an example configuration of a row control circuit in the resistive memory device according to the first embodiment.

As illustrated in FIGS. 7 and 8, one of the 256 pairs of main word lines MWLx and MWLbx (x=<255:0>), the row power supply line VRow, and the write drive lines WDRV<7:0> are connected to the row decoder 10. The group of word line WLx<7:0> is connected to the row decoder 10, and the group of word line WLx<7:0> is connected to the plural memory cells MC that are arrayed in line. As described above, the group of word line WLx<7:0> connected to the one row decoder 10 includes the eight wirings of word line WLx0 to word line WLx7. Similarly the write drive lines WDRV<7:0> are the eight wirings WDRV0 to WDRV7. As illustrated in FIG. 8, the row decoder 10 includes eight transistor pairs each of which sources of two NMOS transistors QN1 and QN2 are connected to each other. The main word line MWLbx is connected to a gate of the transistor QN1 and the row power supply line VRow is connected to a drain of the transistor QN1. The main word line MWLx is connected to the gate of the transistor QN2 and one of the write drive lines WDRV<7:0> is connected to the drain of the transistor QN2. The sources of the transistors QN1 and QN2 are connected to one of the word lines WL included in the group of word line WLx<7:0>.

[Configuration of Main Row Decoder 11]

Figure 9:
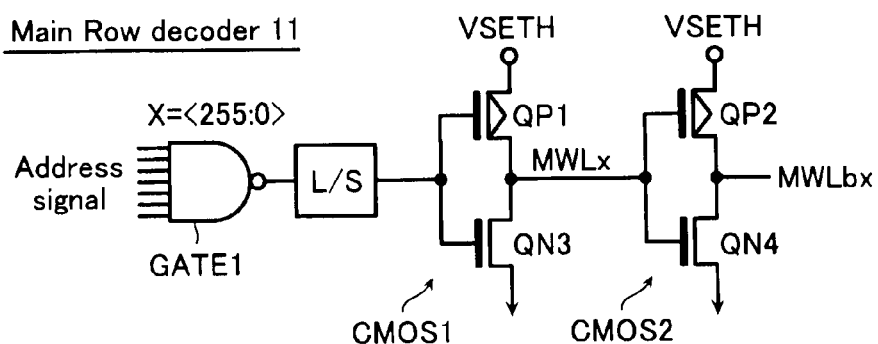
FIG. 9 is a circuit diagram illustrating an example configuration of a row control circuit in the resistive memory device according to the first embodiment.

As illustrated in FIGS. 7 and 9, 256 pairs of main word lines MWLx and MWLbx (x=<255:0>) and an address signal line are connected to the main row decoder 11. The main row decoder 11 is a pre-decoder for driving the word line WL having the hierarchical structure. One set of main word lines MWLx and MWLbx is connected to eight transistor pairs (QN1 and QN2 of FIG. 8) in one row decoder 10, and one row decoder 10 can select one of the eight word lines WLx<7:0>. The main row decoder 11 includes a circuit of FIG. 9 in each set of main word lines MWLx and MWLbx. As illustrated in FIG. 9, in one main row decoder 11, the address signal line connected to the main row decoder 11 is connected to a logic gate GATE1. An output signal of the logic gate GATE1 is supplied to an input terminal of a CMOS inverter CMOS1 through a level shifter L/S. The CMOS inverter CMOS1 includes a PMOS transistor QP1 and an NMOS transistor QN3. A power supply VSETH is connected to the source of the transistor QP1, and the source of the transistor QN3 is grounded. The drains of the transistors QP1 and QN3 are connected to the main word line MWLx. The main word line MWLx is connected to a CMOS inverter CMOS2. The CMOS inverter CMOS2 includes a PMOS transistor QP2 and an NMOS transistor QN4. The power supply VSETH is also connected to the source of the transistor QP2 and the source of the transistor QN4 is grounded. The drains of the transistors QP2 and QN4 are connected to the main word line MWLbx.

[Configuration of Write Drive Line Driver 12]

Figure 10:
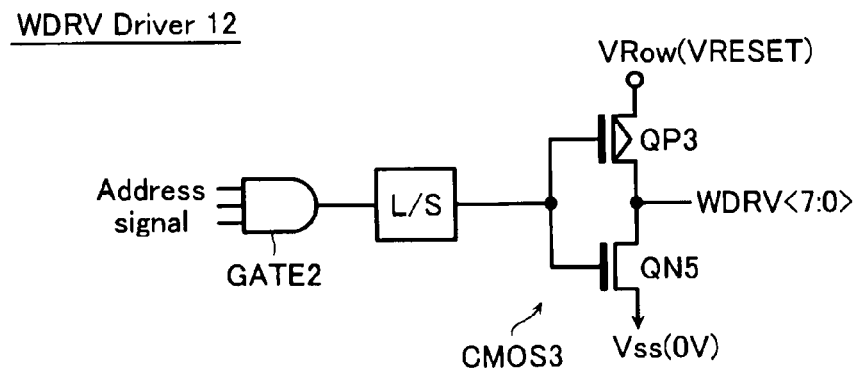
FIG. 10 is a circuit diagram illustrating an example configuration of a row control circuit in the resistive memory device according to the first embodiment.

As illustrated in FIGS. 7 and 10, the row power supply line VRow and the address signal line are connected to the write drive line driver 12. At this point, the write drive line driver 12 is also a pre-decoder. The address signal line connected to the write drive line driver 12 is connected to a logic gate GATE2. An output signal of the logic gate GATE2 is supplied to an input terminal of a CMOS inverter CMOS3 through a level shifter L/S. The CMOS inverter CMOS3 includes a PMOS transistor QP3 and an NMOS transistor QN5. The row power supply line VRow to which the voltage VRESET is applied as described later is connected to the source of the transistor QP3, and the source of the transistor QN5 is grounded. The drains of the transistors QP3 and QN5 are connected to the write drive lines WDRV<7:0>.

[Configuration of Row Power Supply Line Driver 13]

Figure 11:
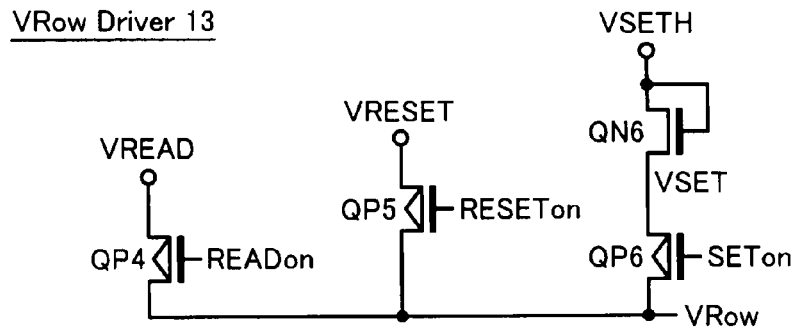
FIG. 11 is a circuit diagram illustrating an example configuration of a row control circuit in the resistive memory device according to the first embodiment.

As illustrated in FIGS. 7 and 11, the row power supply line VRow and a control signal line are connected to the row power supply line driver 13. In the row power supply line driver 13, the power supply VSETH is connected to the drain and gate of the NMOS transistor QN6. The source of the transistor QN6 is connected to the row power supply line VRow through a PMOS transistor QP6. A control signal SETon is supplied to the gate of the transistor QP6. In the row power supply line driver 13, the power supply VREAD is connected to the row power supply line VRow through a PMOS transistor QP4, and the power supply VRESET is connected to the row power supply line VRow through a PMOS transistor QP5. A control signal READon is supplied to the gate of the transistor QP4, and a control signal RESETon is supplied to the gate of the transistor QP5. The control signals READon and RESETon are changed from the "H" state to the "L" state in reading the data and in the reset operation, respectively.

A detailed configuration of the column control circuit will be described with reference to FIGS. 12 to 15. FIGS. 12 to 15 are circuit diagrams illustrating an example of the configuration of the column control circuit in the resistive memory device.

[Configuration of Column Switch 20]

Figure 12:
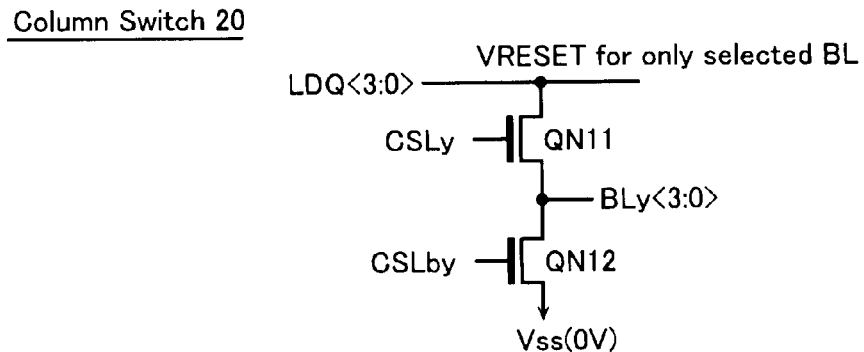
FIG. 12 is a circuit diagram illustrating an example configuration of a column control circuit in the resistive memory device according to the first embodiment.

As illustrated in FIGS. 7 and 12, one of the 128 pairs of column selection lines CSLy and CSLby (y=<127:0>) and the local data lines LDQ<3:0> are connected to the column switch 20. The group of bit line BLy<3:0> is connected to the column switch 20, and the group of bit line Bly<3:0> is connected to the plural memory cells MC that are arranged in line. As described above, the group of bit line BLy<3:0> connected to one column switch 20 includes the four wirings of bit line BLy0 to bit line BLy3. Similarly, the local data lines LDQ<3:0> includes the four wirings LDQ0 to LDQ3. As illustrated in FIG. 12, the column switch 20 includes four pairs of transistors each of which sources of two NMOS transistors QN11 and QN12 are connected to each other. The column selection line CSLy is connected to the gate of the transistor QN11, and one of the local data lines LDQ<3:0> is connected to the drain of the transistor QN11. The column selection line CSLby is connected to the gate of the transistor QN12, and the drain of the transistor QN12 is grounded. The sources of the transistors QN11 and QN12 are connected to one of the bit lines BL included in the group of bit line BLy<3:0>.

[Configuration of Column Decoder 21]

Figure 13:
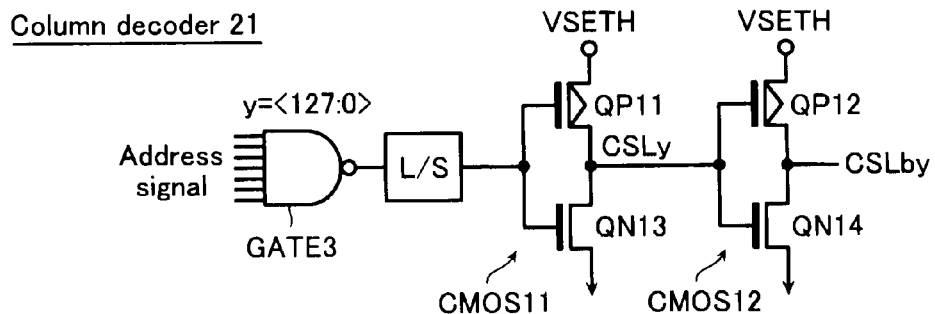
FIG. 13 is a circuit diagram illustrating an example configuration of a column control circuit in the resistive memory device according to the first embodiment.

As illustrated in FIGS. 7 and 13, the 128 pairs of column selection lines CSLy and CSLby (y=<127:0>) and the address signal line are connected to the column decoder 21. In the resistive memory device of the embodiment, one set of column selection lines CSLy and CSLby is connected to four transistor pairs (QN11 and QN12 of FIG. 12) in one column switch 20, and one column switch 20 selectively drives one of bit lines in the groups of bit line Bly<3:0>. The column decoder 21 includes a circuit of FIG. 13 in each pair of column selection lines CSLy and CSLby. As illustrated in FIG. 13, in one column decoder 21, the address signal line connected to the column decoder 21 is connected to a logic gate GATE3. An output signal of the logic gate GATE3 is supplied to an input terminal of a CMOS inverter CMOS11 through a level shifter L/S. The CMOS inverter CMOS11 includes a PMOS transistor QP11 and an NMOS transistor QN13. The power supply VSETH is connected to the source of the transistor QP11 and the source of the transistor QN13 is grounded. The drains of the transistors QP11 and QN13 are connected to the column selection line CSLy. The column selection line CSLy is connected to a CMOS inverter CMOS12. The CMOS inverter CMOS12 includes a PMOS transistor QP12 and an NMOS transistor QN14. The power supply VSETH is also connected to the source of the transistor QP12, and the source of the transistor QN14 is grounded. The drains of the transistors QP12 and QN14 are connected to the column selection line CSLby.

[Configuration of Sense Amplifier/Write Buffer 22]

Figure 14:
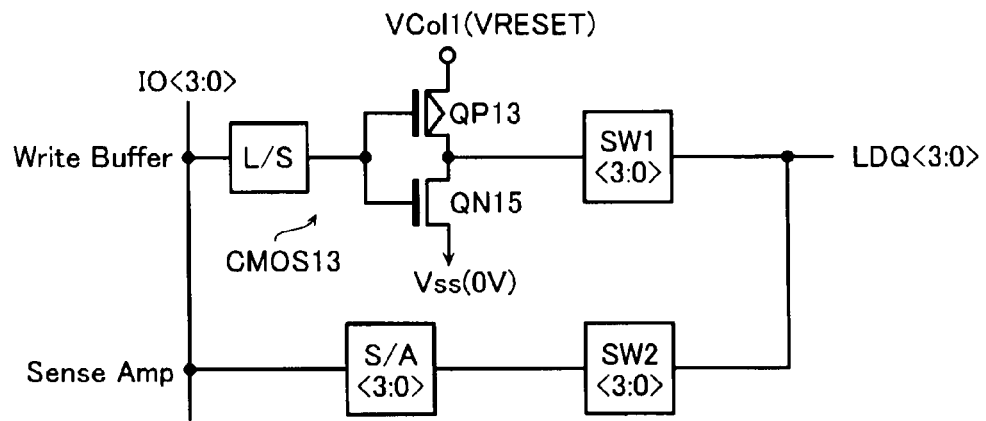
FIG. 14 is a circuit diagram illustrating an example configuration of a column control circuit in the resistive memory device according to the first embodiment.

As illustrated in FIGS. 7 and 14, the column power supply line VCol1, the local data lines LDQ<3:0>, and the data input and output lines IO<3:0> are connected to the sense amplifier/write buffer 22. A configuration of the write buffer portion will be described below. The data input and output lines IO<3:0> connected to the sense amplifier/write buffer 22 are connected to a CMOS inverter CMOS13 through a level shifter L/S. The CMOS inverter CMOS13 includes a PMOS transistor QP13 and an NMOS transistor QN15. The column power supply line VCol1 is connected to the source of the transistor QP13. The reset voltage VRESET is applied to the column power supply line VCol1 as described later. The source of the transistor QN15 is grounded. The drains of the transistors QP13 and QN15 are connected to the local data lines LDQ<3:0> through a switch SW1.

Then a sense amplifier portion will be described below. The data input and output lines IO<3:0> connected to the sense amplifier/write buffer 22 are connected to a sense amplifier S/A. A various type of sense amplifier may be used as the sense amplifier S/A, such as single end type, differential type using a reference cell, and so on. An output terminal of the sense amplifier S/A is connected to the local data lines LDQ<3:0> through a switch SW2.

[Configuration of Column Power Supply Line Driver 23]

Figure 15:
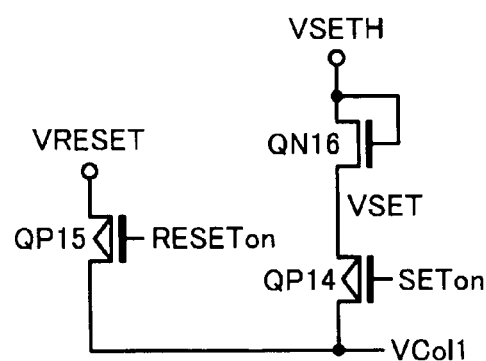
FIG. 15 is a circuit diagram illustrating an example configuration of a column control circuit in the resistive memory device according to the first embodiment.

As illustrated in FIGS. 7 and 15, the column power supply line VCol1 and the control signal line are connected to the column power supply line driver 23. In the column power supply line driver 23, the power supply VSETH is connected to a drain and a gate of an NMOS transistor QN16, and a source of the transistor QN16 is connected to the column power supply line VCol1 through a PMOS transistor QP14. The control signal SETon is supplied to the gate of the transistor QP14. In the column power supply line driver 23, the power supply VRESET is connected to the column power supply line VCol1 through a PMOS transistor QP15. The control signal RESETon is supplied to the gate of the transistor QP15. The control signal RESETon is changed from the "H" state to the "L" state in the reset operation.

Reset operations in the resistive memory device so configured will now be described below. Referring first to FIGS. 7 to 11, the operation of a row control circuit in the resistive memory device in reset operation will be described below. As illustrated in FIG. 7, the word lines WL have a hierarchical structure. The voltage, which is applied to write drive lines WDRV<7:0> or a row power supply line VRow, is applied to a group of word lines WLx<7:0> selectively driven by the main row decoder 11 and the row decoder 10. Firstly, the operation for applying voltage to the write drive lines WDRV<7:0> and the row power supply line VRow that are connected to the row decoder 10 will be described below.

[Operation of Row Power Supply Line Driver 13]

In reset operation, at a row power supply line driver 13, a control signal (RESETon signal) that has been supplied to the gate of a transistor QP5 becomes "L" state and the transistor QP5 is conductive. The row power supply line driver 13 drives the row power supply line VRow to a voltage VRESET in reset operation.

[Operation of Write Drive Line Driver 12]

A write drive line driver 12 has a logic gate GATE2 to which an address signal is input. Based on the address signal, the logic gate GATE2 supplies to the input terminal of a CMOS inverter CMOS3 an "H" signal for one of the write drive lines (e.g., WDRV1) that corresponds to the address signal, and an "L" signal for every other write drive line that does not correspond to the address signal. For a write drive line (e.g., WDRV1) that corresponds to the address signal, an "H" signal is supplied to the input terminal of the CMOS inverter CMOS3, and a ground voltage Vss (e.g., 0 V) is applied to the write drive line WDRV1 via the conductive transistor QN5. For every other write drive line that does not correspond to the address signal, an "L" signal is supplied to the input terminal of the CMOS inverter CMOS3, and the voltage of the row power supply line VRow (VRESET) is applied to the write drive lines WDRV via the conductive transistor QP3.

Secondly, how the main word lines MWLx, MWLbx and the word lines WLx<7:0> are selectively driven by the main row decoder 11 and the row decoder 10 will be described below.

[Operation of Main Row Decoder 11]

An address signal is also supplied to the input terminal of a logic gate GATE1 in the main row decoder 11. Based on the address signal, the logic gate GATE1 supplies to the input terminal of a CMOS inverter CMOS1 an "L" signal for the selected x (e.g., x=0) of x=<255:0>, and an "H" signal for every non-selected x. Firstly, description is made on the selected x (e.g., x=0). For the selected x (e.g., x=0), an "L" signal is supplied to the input terminal of the CMOS inverter CMOS1, and an "H" signal of the power supply VSETH is supplied to a main word line MWL0 via the conductive transistor QP1. In addition, the "H" signal of the main word line MWL0 is supplied to the input terminal of a CMOS inverter CMOS2, and the "L" signal at ground voltage Vss is supplied to a main word line MWLb0 via the conductive transistor QN4. That is, for the selected x (e.g., x=0), an "H" signal is supplied to the main word line MWL0, while an "L" signal is supplied to the main word line MWLb0. Secondly, description is made on the non-selected x. For each non-selected x, an "H" signal is supplied to the input terminal of a CMOS inverter CMOS1, and an "L" signal at ground voltage Vss is supplied to a main word line MWLx via the conductive transistor QN3. In addition, the "L" signal of the main word line MWLx is supplied to the input terminal of a CMOS inverter CMOS2, and the signal of the power supply VSETH is supplied to a main word line MWLbx via the conductive transistor QP2. That is, for each non-selected x, an "L" signal is supplied to a respective main word line MWLx, while an "H" signal is supplied to a respective main word line MWLbx.

[Operation of Row Decoder 10]

The row decoder 10 applies the voltage of the row power supply line VRow or the write drive lines WDRV to the corresponding word lines WL based on the signals supplied to the main word lines MWLx and MWLbx. For the selected x (e.g., x=0), an "H" signal is supplied to the main word line MWL0 and an "L" signal is supplied to the main word line MWLb0. Since an "L" signal is supplied to the gate of a transistor QN1 and an "H" signal is supplied to the gate of a transistor QN2 in the row decoder 10, the voltage of the write drive lines WDRV<7:0> is applied to the group of word lines WL0<7:0> via the conductive transistor QN2. In this case, a ground voltage (e.g., 0 V) is applied to a write drive line (e.g., WDRV1) that corresponds to the address signal, and the voltage of the row power supply line VRow (e.g., VRESET) is applied to the other write drive lines that do not correspond to the address signal. The ground voltage (e.g., 0 V) is only applied to one of the word lines WL01 among the group of word lines WL0<7:0> that corresponds to the address signal, while the voltage VRESET is applied to the other word lines WL. In addition, for each non-selected x, an "L" signal is supplied to a main word line MWLx and an "H" signal is supplied to a main word line MWLbx. Since an "H" signal is supplied to the gate of the transistor QN1 and an "L" signal is supplied to the gate of the transistor QN2 in the row decoder 10, the voltage of the row power supply line VRow (VRESET) is applied to the group of word lines WLx<7:0> via the conductive transistor QN1. As a result, in reset operation, the ground voltage (0 V) is only applied to one of the word lines WL01 that is selected by the address signal, while the voltage of the row power supply line VRow (VRESET) is applied to every other word line WL.

Referring now to FIG. 7 and FIGS. 12 to 15, the operation of a column control circuit in the resistive memory device in reset operation will be described below. The voltage, which is applied to local data lines LDQ<3:0>, is applied to a group of bit lines BLy<3:0> selectively driven by a column decoder 21 and a column switch 20. In addition, the voltage of a column power supply line VCol1 is applied to the local data lines LDQ<3:0> via a sense amplifier/write buffer 22. Firstly, the operation for applying the voltage to the local data lines LDQ<3:0> and the column power supply line VCol1 will be described below.

[Operation of Column Power Supply Line Driver 23]

In reset operation, at a column power supply line driver 23, a control signal (RESETon signal) that has been supplied to the gate of a transistor QP15 becomes "L" state and the transistor QP15 is conductive. The column power supply line driver 23 drives the column power supply line VCol1 to a voltage VRESET in reset operation.

[Operation of Sense Amplifier/Write Buffer 22]

In reset operation, at a sense amplifier/write buffer 22, switches SW1 of the write buffer part turn on and become conductive, while switches SW2 of the sense amplifier part turn off and become non-conductive. Write data is supplied to the sense amplifier/write buffer 22 from data input/output lines IO<3:0>. The write data is supplied to the input terminal of a CMOS inverter CMOS13 via a level shifter L/S. For a local data line (e.g., LDQ1), an "L" signal is supplied to the input terminal of the CMOS inverter CMOS13, and the voltage of the column power supply line VCol1 (VRESET) is applied to the local data line LDQ1 via the conductive transistor QP13 and the switch SW1. For every other local data line that does not correspond to the write data, an "H" signal is supplied to the input terminal of the CMOS inverter CMOS13, and a ground voltage Vss (e.g., 0 V) is applied to the local data lines LDQ via the conductive transistor QN15 and the switch SW1.

Secondly, how column selection lines CSLy and CSLby and a group of bit lines BLy<3:0> are selectively driven by the column decoder 21 and the column switch 20 will be described below.

[Operation of Column Decoder 21]

An address signal is supplied to the input terminal of a logic gate GATE3 in the column decoder 21. Based on the address signal, the logic gate GATE3 supplies to the input terminal of a CMOS inverter CMOS11 an "L" signal for each y (e.g., y=0) selected from y=<127:0>, and an "H" signal for each non-selected y. Firstly, description is made on the selected y (e.g., y=0). For selected y (e.g., y=0), an "L" signal is supplied to the input terminal of the CMOS inverter CMOS11, and an "H" signal of the power supply VSETH is supplied to a column selection line CSL0 via the conductive transistor QP11. In addition, the "H" signal of the column selection line CSL0 is supplied to the input terminal of a CMOS inverter CMOS12, and the "L" signal at ground voltage Vss is supplied to a column selection line CSLb0 via the conductive transistor QN14. That is, for selected y (e.g., y=0), an "H" signal is supplied to the column selection line CSL0, while an "L" signal is supplied to the column selection line CSLb0. Secondly, description is made on the non-selected y. For each non-selected y, an "H" signal is supplied to the input terminal of the CMOS inverter CMOS11, and an "L" signal at ground voltage Vss is supplied to the column selection line CSLy via the conductive transistor QN13. In addition, the "L" signal of the column selection line CSLy is supplied to the input terminal of the CMOS inverter CMOS12, and an "H" signal of the power supply VSETH is supplied to the column selection line CSLby via the conductive transistor QP12. That is, for each non-selected y, an "L" signal is supplied to the column selection line CSLy, while an "H" signal is supplied to the column selection line CSLby.

[Operation of Column Switch 20]

The column switch 20 applies the voltage of local data lines LDQ<3:0> to the bit lines BL based on the signals supplied to the column selection lines CSLy and CSLby. For the selected y (e.g., y=0), an "H" signal is supplied to the column selection line CSL0 and an "L" signal is supplied to the column selection line CSLb0. An "H" signal is supplied to the gate of a transistor QN11 and an "L" signal is supplied to the gate of a transistor QN12 in the column switch 20. Thus, the reset voltage VRESET of the local data lines LDQ<3:0> is applied to each of the selected groups of bit lines BL0<3:0> via the conductive transistor QN11. In this case, the reset voltage (e.g., VRESET) is applied to a local data line (e.g., LDQ1) that corresponds to the write data, and the ground voltage (e.g., Vss=0 V) is applied to the other local data lines that do not correspond to the write data. The reset voltage (e.g., VRESET) is only applied to one of the bit line BL01 among the group of bit lines BL0<3:0> that corresponds to the address signal, while the ground voltage Vss is applied to the other bit lines BL. On the other hand, for each non-selected y, an "L" signal is supplied to the column selection line CSLy and an "H" signal is supplied to the column selection line CSLby. An "L" signal is supplied to the gate of the transistor QN11 and an "H" signal is supplied to the gate of the transistor QN12 in the column switch 20. Thus, a ground voltage Vss=0 V is applied to the group of bit lines BLy<3:0> via the conductive transistor QN12. As a result, in reset operation, the voltage VRESET is applied to the bit line BL01 only that is selected by the write data, while the ground voltage (0 V) is applied to every other bit line BL.

According to the column control circuit and the dummy bit line control circuit of the embodiment, the reset voltage VRESET is applied to the bit lines BL disposed in the memory cell array MA in the reset operation while the voltage Vα is applied to the dummy bit line dBL. The voltage Vα is continuously applied even after the selected memory cell MC11 changes to the high resistance state. Even after the selected memory cell MC11 is placed in the high resistance state and the reset current is difficult to flow, a potential of the selected word line WL01 is increased by the voltage Vα applied to the dummy bit line dBL. Accordingly, the voltage applied to the selected memory cell MC11 is more eased than the reset voltage VRESET and does not exceed the set voltage VSET at which the erroneous set operation may be generated. According to the resistive memory device of the embodiment, generation of the erroneous set operation after the reset operation can be prevented.

The dummy current Idummy, which flows to the dummy memory cell dMC in the memory cell array MA, changes based on the change of a voltage in the memory cell array MA. Accordingly, a response speed of the embodiment is faster than, for example, a monitor circuit disposed outside the memory cell array to detect the change of the current for executing an erroneous set preventing operation so that an erroneous set operation can be effectively prevented. When generation of the erroneous set operation can be effectively prevented, since controllability of the reset operation with respect to the memory cells is increased, an operation speed is increased. Further, since an influence of the parasitic resistance of the wirings is reduced, a size of one memory cell array can be increased and an overall chip size can be reduced.

[Second Embodiment]

Figure 16A:
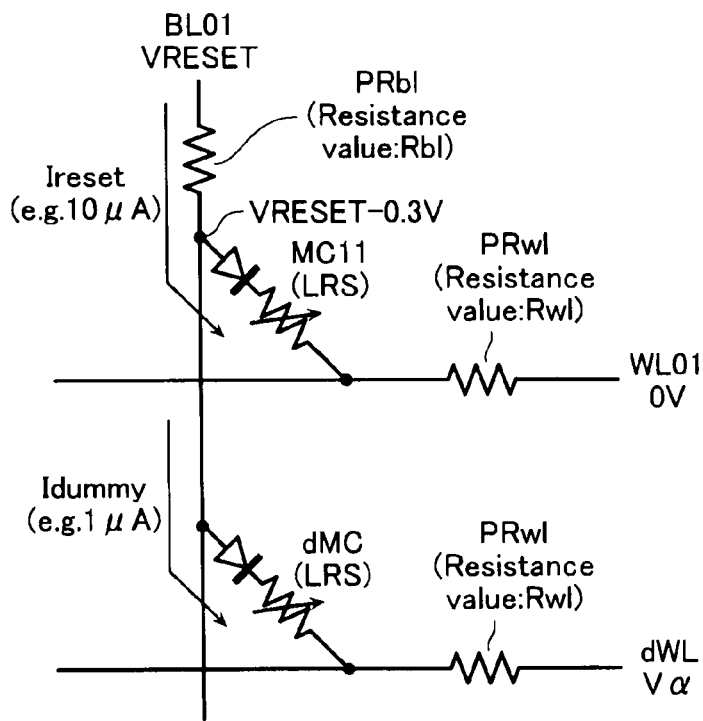
FIG. 16A is a view for explaining a voltage drop in a reset operation of a resistive memory device according to a second embodiment.
Figure 16B:
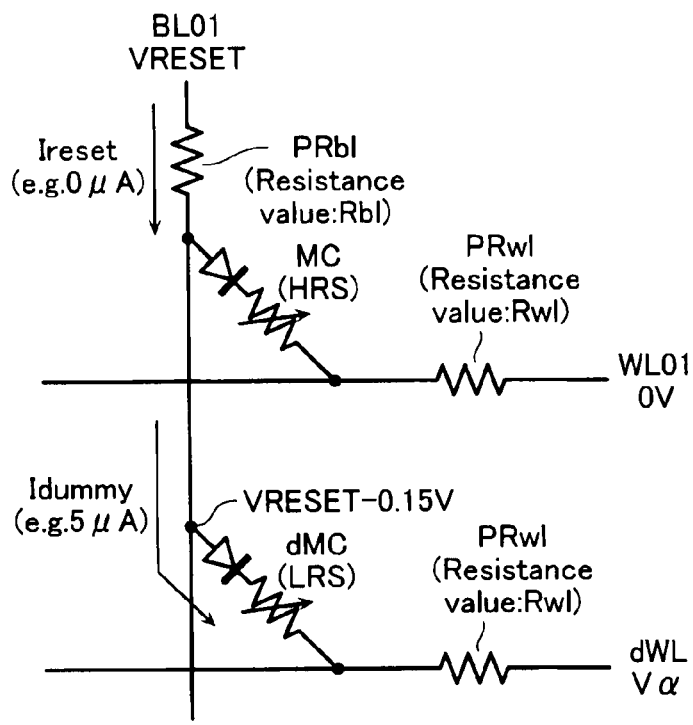
FIG. 16B is a view for explaining a voltage drop in the reset operation of the resistive memory device according to the second embodiment.

Next, the reset operation in a resistive memory device according to a second embodiment will be explained referring to FIGS. 16A and 16B. FIGS. 16A and 16B are views for explaining voltage drops in the reset operation of the resistive memory device according to the embodiment.

As shown in FIG. 16A, a dummy word line dWL is disposed in a memory cell array MA of the embodiment in place of the dummy bit line dBL of the first embodiment. A dummy memory cell dMC composed of a rectifier element and a resistance element is connected to an intersecting portion between the dummy word line dWL and a bit line BL. Like the first embodiment, a memory cell having substantially the same resistance value as that of a low resistance state of a memory cell MC is used as the dummy memory cell dMC.

As shown in FIG. 16A, a reset current Ireset flows from a selected bit line BL01 to a selected word line WL01 through a selected memory cell MC11 in the low resistance state also in the reset operation of the resistive memory device according to the embodiment. Further, a certain voltage Vα lower than a reset voltage VRESET is applied to the dummy word line dWL. Accordingly, a dummy current Idummy flows from the selected bit line BL01 to the dummy word line dWL through the dummy memory cell dMC in the low resistance state. The reset voltage VRESET applied to the selected bit line BL01 is dropped through a parasitic resistance PRbl of bit lines BL. Accordingly, a voltage in a portion where the selected memory cell MC11 is connected to the selected bit line BL01 is lower by about 0.3 V than the reset voltage VRESET. The voltage is dropped by the selected memory cell MC11 and a parasitic resistance PRwl of word lines WL, and a final potential of the selected word line WL01 becomes 0 V. The voltage Vα applied to the dummy bit line dWL is lower than the reset voltage, and the voltage in the portion where the selected memory cell MC11 is connected to the bit line BL01 is lower by about 0.3 V than the reset voltage VRESET. Accordingly, a value of the dummy current Idummy flowing to the dummy memory cell dMC becomes a value smaller than that of the reset current Ireset.

Next, as shown in FIG. 16B, when the selected memory cell MC11 is placed in a high resistance state by the reset operation, almost no reset current Ireset flows to the selected memory cell MC11. In contrast, since the dummy memory cell dMC is permanently in the low resistance state, the dummy current Idummy continuously flows even after the reset current Ireset stops flowing. Since no current flows from the selected memory cell MC11 to the selected word line WL01, the dummy current Idummy flows more easily than before the selected memory cell MC11 is placed in the high resistance state. The voltage VRESET applied to the selected bit line BL01 is dropped by a parasitic resistance PRbl of the selected bit line BL01, and a voltage of a portion where the dummy memory cell dMC is connected to the bit line BL01 is lower by about 0.15 V than the reset voltage VRESET. The voltage is dropped by the dummy memory cell dMC in the low resistance state and the parasitic resistance PRwl of the word lines WL, and a final potential of the dummy word line dWL becomes Vα.

In the reset operation of the embodiment, a voltage applied to the selected memory cell MC11 whose reset operation is finished is a voltage obtained by subtracting the voltage 0.15 V which is dropped by the selected bit line BL01 from the reset voltage VRESET applied to the selected bit line BL01. Accordingly, the voltage applied to the selected memory cell MC11 is more eased than the reset voltage VRESET applied to the selected bit line BL01 and does not exceed a set voltage VSET at which an erroneous set operation may be generated. According to the resistive memory device of the embodiment, generation of the erroneous set operation after the reset operation can be prevented.

Figure 17:
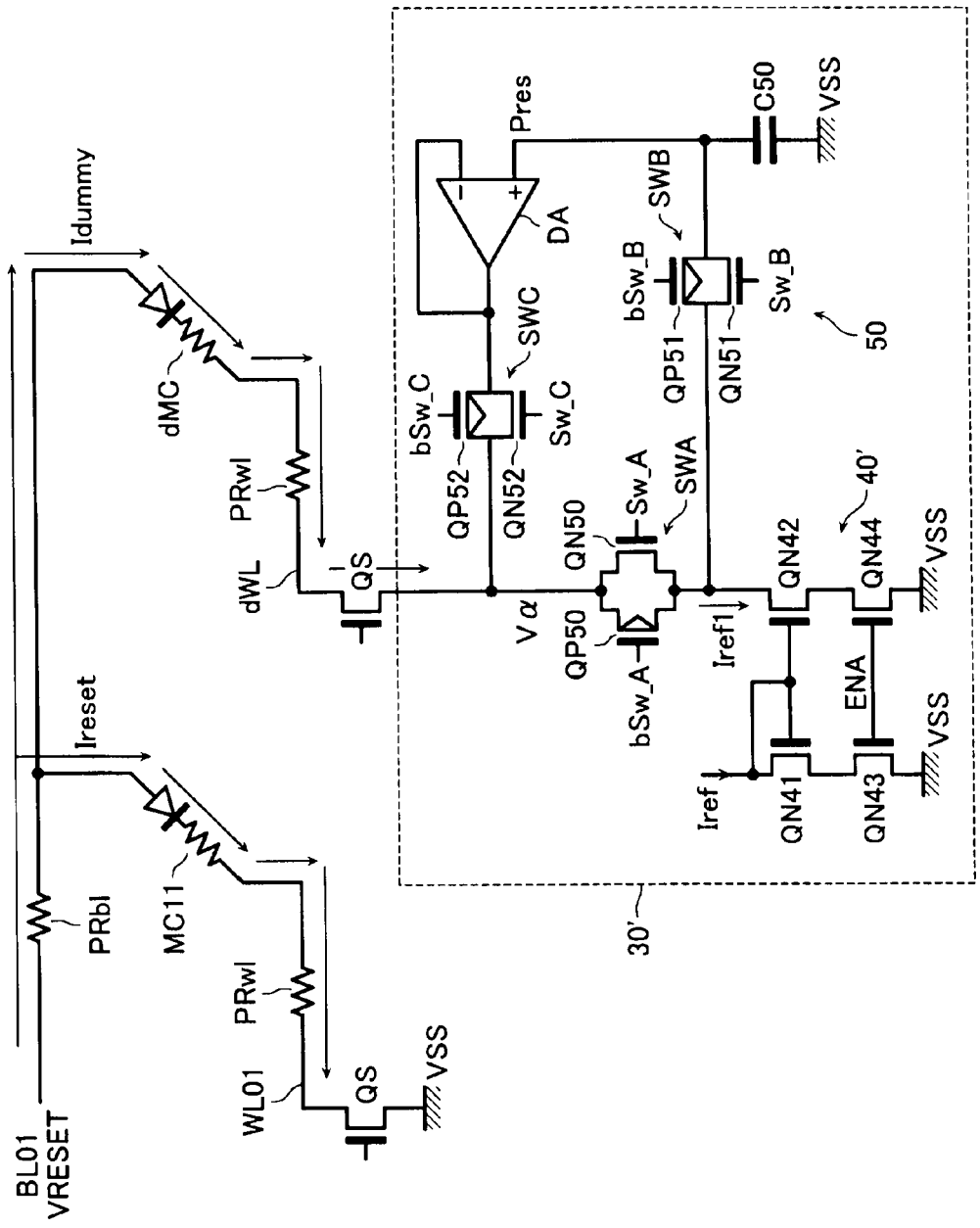
FIG. 17 is a circuit diagram showing a configuration example of a dummy word line control circuit in the resistive memory device according to the second embodiment.

Next, a circuit configuration of the resistive memory device which applies the voltage Vα to the dummy word line dWL in the reset operation will be explained referring to FIG. 17. FIG. 17 is a circuit diagram showing a configuration example of a dummy word line control circuit 30' as another aspect of the bias voltage application circuit of the resistive memory device. The dummy word line control circuit 30' is a control circuit which continuously applies the certain voltage Vα to the dummy word line dWL even if the dummy current Idummy is varied by the reset operation of the selected memory cell MC11. Even if a resistance state of the selected memory cell MC11 transits to the high resistance state, a potential variation of the selected bit line BL01 can be suppressed by the bias voltage Vα. The reset voltage VRESET is applied to the selected bit line BL01, and a ground voltage Vss is applied to the selected word line WL01 through a switch transistor QS, respectively.

[Configuration and Operation of Dummy Word Line Control Circuit 30']

In the dummy word line control circuit 30' according to the second embodiment, explanation of portions having the same configurations as those of the dummy bit line control circuit 30 according to the first embodiment is omitted by denoting the portions by the same reference numerals. The dummy word line control circuit 30' according to the embodiment is different from the dummy bit line control circuit 30 in that a current mirror output circuit is omitted in a constant current circuit 40'. The other configurations and operations in the dummy word line control circuit 30' are the same as those of the dummy bit line control circuit 30 of the first embodiment. Even if the selected memory cell MC11 is placed in the high resistance state after the reset operation, the dummy current Idummy is increased by the dummy word line control circuit 30' and the certain voltage Vα is continuously applied to the dummy word line dWL. When the voltage Vα is continuously applied to the dummy word line dWL to which the dummy memory cell dMC is connected, a voltage is dropped by the dummy current Idummy and the parasitic resistance PRbl of the bit line BL01 and a voltage of a connection end of the bit lines BL side of the memory cell MC11 more decreases than the reset voltage VRESET. As a result, generation of the erroneous set operation after the reset operation can be prevented.

Figure 18:
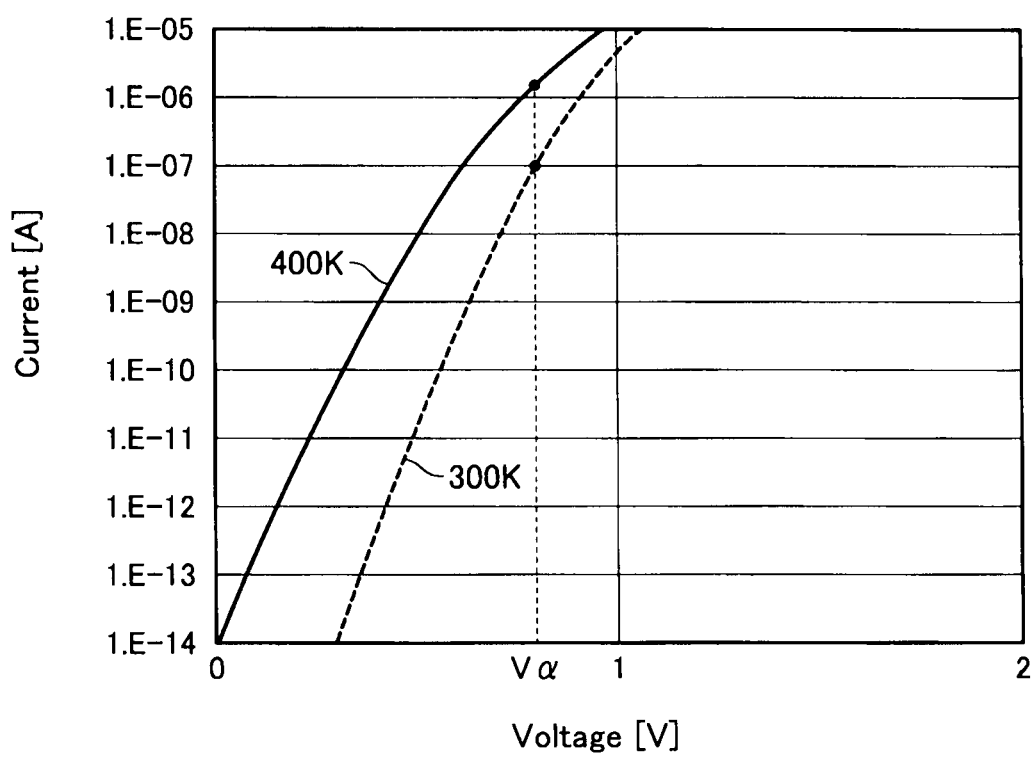
FIG. 18 is a graph showing current-voltage characteristics of a diode in a resistive memory device.

Although the embodiments of the invention have been explained above, the invention is by no means limited thereto and various changes, additions, combinations, and the like are possible within the scope which does not depart from the gist of the invention. For example, to optimally set the dummy current Idummy flowing to the dummy memory cell dMC, a voltage applied to the dummy word line dWL or the dummy bit line dBL connected to the dummy memory cell dMC may be adjusted to an appropriate state before or after the reset operation of a selected memory cell MC. FIG. 18 is a graph showing characteristics of a voltage applied to a diode Di of the resistive memory device and a current flowing to the diode Di. FIG. 18 shows current-voltage characteristics at temperatures of 300K and 400K. As shown in FIG. 18, when the voltage Vα applied to the diode Di of the dummy memory cell dMC is set so that the dummy current Idummy flowing to the diode Di becomes about 1 μA, the dummy current Idummy changes by about one order of magnitude by changing the voltage by about 0.3 V.

Figure 19A:
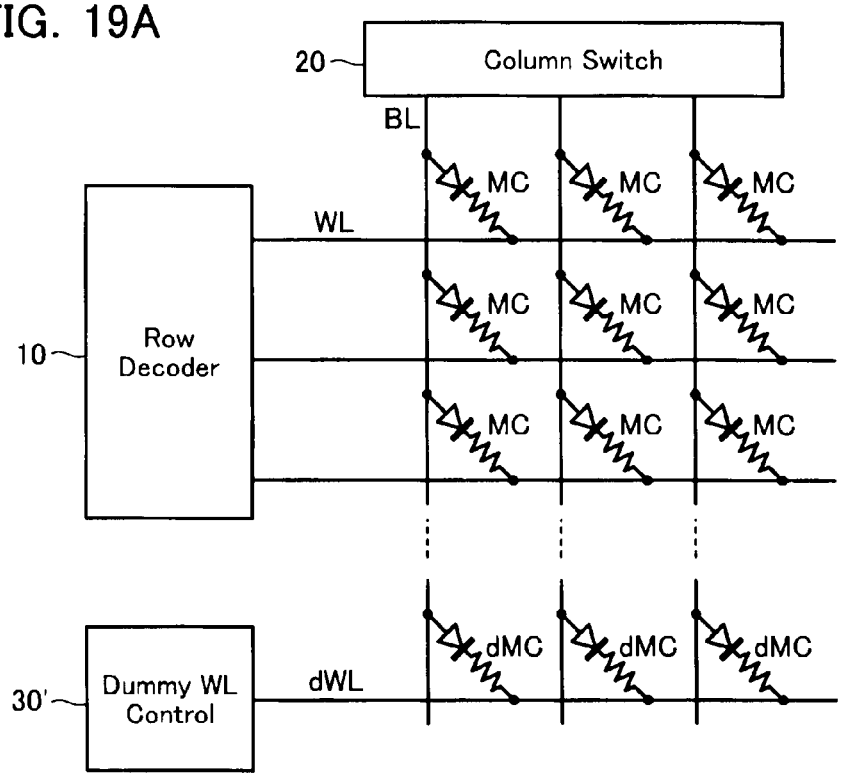
FIG. 19A is a view showing a configuration example of memory cell arrays in the resistive memory device.
Figure 19B:
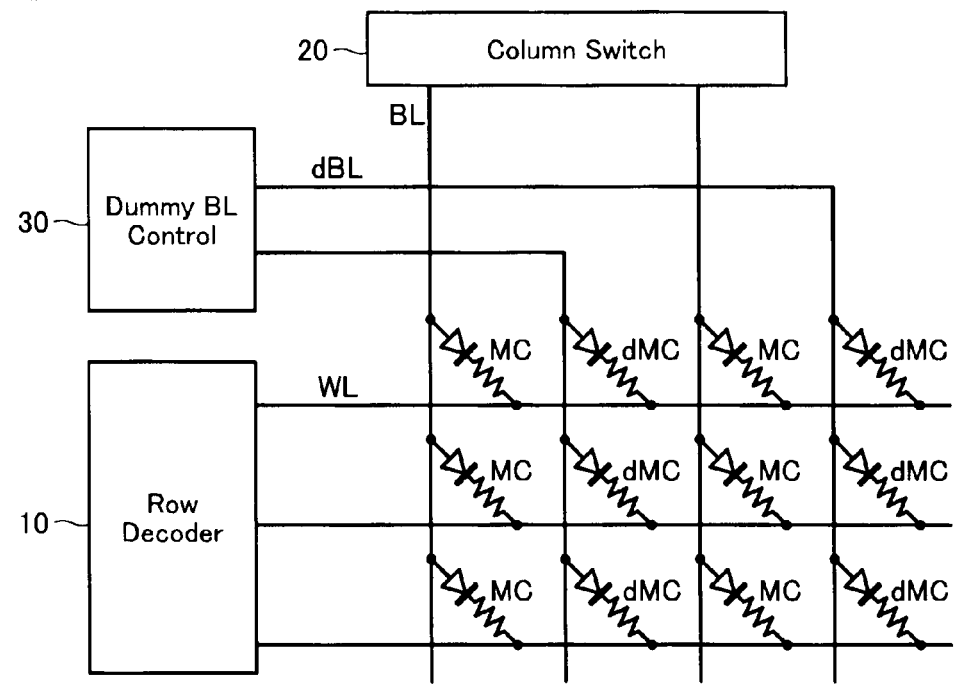
FIG. 19B is a view showing a configuration example of memory cell arrays in the resistive memory device.

Further, as shown in configuration examples of memory cell arrays of FIGS. 19A and 19B, dummy memory cells dMC in memory cell arrays MA may be disposed by a method of disposing the dummy memory cells dMC in end portions of bit lines BL or word lines WL where a voltage drop is maximized, i.e., end portions of the memory cell arrays MA (FIG. 19A), or a method of appropriately dispersing dummy memory cells dMC so that a dummy memory cell dMC, which is selected by its address from the dispersed memory cells MC, can be changed (FIG. 19B).

What is claimed is:

1. A semiconductor storage device comprising:
a cell array including a plurality of first wirings, a plurality of second wirings intersecting the first wirings, and memory cells positioned at intersecting portions between the first wirings and the second wirings, each of the memory cells having a variable resistance element;
a control circuit configured to apply a first voltage to one of the first wirings and a second voltage lower than the first voltage to one of the second wirings; and
a bias voltage application circuit including a dummy memory cell positioned at an intersecting portion between another one of the first wirings and the one of the second wirings, and a dummy wiring control circuit configured to apply a dummy wiring control voltage to the other one of the first wirings when the control circuit applies the first voltage to the one of the first wirings.

2. The semiconductor storage device according to claim 1, wherein the dummy wiring control voltage suppresses a potential variation of the one of the second wirings connected to a selected variable resistance element.

3. The semiconductor storage device according to claim 2, wherein the bias voltage application circuit outputs a voltage, which is larger than a voltage obtained by subtracting a voltage by which the memory cells transit from a high resistance state to a low resistance state from the first voltage applied to the one of the first wirings, as the dummy wiring control voltage.

4. The semiconductor storage device according to claim 2, wherein the bias voltage application circuit keeps the dummy wiring control voltage by increasing a current flowing to the other one of the first wirings when the memory cells transit from a low resistance state to a high resistance state.

5. The semiconductor storage device according to claim 2, wherein the dummy memory cell is disposed in an end portion of the one of the second wirings.

6. The semiconductor storage device according to claim 2, wherein the dummy memory cell is a memory cell permanently placed in a low resistance state by breaking the variable resistance element.

7. The semiconductor storage device according to claim 1, wherein the bias voltage application circuit comprises:

a constant current circuit configured to supply a constant current to the other one of the first wirings when the control circuit applies the first voltage to the one of the first wirings;

a sampling circuit configured to sample a potential on the other one of the first wirings just after the constant current circuit supplies the constant current to the other one of the first wirings; and an amplifying circuit configured to keep the potential on the other one of the first wirings as the dummy wiring control voltage during a period in which the one of the first wirings is applied with the first voltage.

8. The semiconductor storage device according to claim 1, wherein each of the memory cells has a non-ohmic element.

9. The semiconductor storage device according to claim 1, wherein the control circuit is configured to apply a third voltage higher than the second voltage to others of the second wirings.

10. The semiconductor storage device according to claim 9, wherein the third voltage is equal to the first voltage.

* * * * *